United States Patent
Yanagisawa

(10) Patent No.: US 9,478,307 B2
(45) Date of Patent: Oct. 25, 2016

(54) MEMORY DEVICE, WRITING METHOD, AND READING METHOD

(71) Applicant: Sony Corporation, Tokyo (JP)

(72) Inventor: Yuki Yanagisawa, Kanagawa (JP)

(73) Assignee: Sony Semiconductor Solutions Corporation, Atsugi-Shi (JP)

(*) Notice: Subject to any disclaimer, the term of this patent is extended or adjusted under 35 U.S.C. 154(b) by 0 days.

(21) Appl. No.: 14/483,669

(22) Filed: Sep. 11, 2014

(65) Prior Publication Data

US 2015/0103579 A1   Apr. 16, 2015

(30) Foreign Application Priority Data

Oct. 10, 2013 (JP) .................. 2013-212960

(51) Int. Cl.
| | |
|---|---|
| G11C 17/12 | (2006.01) |
| G11C 17/16 | (2006.01) |
| G11C 11/56 | (2006.01) |
| G11C 17/18 | (2006.01) |

(52) U.S. Cl.
CPC ......... *G11C 17/123* (2013.01); *G11C 11/5692* (2013.01); *G11C 17/16* (2013.01); *G11C 17/18* (2013.01)

(58) Field of Classification Search
CPC ............................ G11C 17/123; G11C 17/165
USPC ......................................................... 365/96
See application file for complete search history.

(56) References Cited

U.S. PATENT DOCUMENTS

| | | | |
|---|---|---|---|
| 7,206,214 B2* | 4/2007 | Hoefler ................. | G11C 17/16 257/E27.102 |
| 2008/0186757 A1* | 8/2008 | Lin et al. ...................... | 365/158 |
| 2009/0279349 A1* | 11/2009 | Shih et al. ..................... | 365/163 |
| 2012/0212992 A1* | 8/2012 | Kanematsu et al. .......... | 365/103 |
| 2015/0302932 A1* | 10/2015 | Yanagisawa ....... | G11C 13/0069 365/96 |

FOREIGN PATENT DOCUMENTS

| | | |
|---|---|---|
| JP | 2006-510203 A | 3/2006 |
| JP | 2012-174864 A | 9/2012 |

OTHER PUBLICATIONS www.wikipedia.org/wiki/MOSFET, accessed Jun. 16, 2015 (attached) "Design of small-area multi-bit antifuse-type 1 kbit OTP memory", Li Long-zhen,Lee J H, Kim T H, Jin K H, Park M H, Ha P B, Kim Y H ,J. Cent. South Univ. Technol. (2009) 16: 0467-0473 (attached).*

* cited by examiner

*Primary Examiner* — Alexander Sofocleous
*Assistant Examiner* — Mushfique Siddique
(74) *Attorney, Agent, or Firm* — Michael Best & Friedrich LLP

(57) ABSTRACT

A memory device includes a memory cell which has one cell selection section and a storage section which is connected in series with respect to the cell selection section and which is selected as an access target for writing or reading by the cell selection section, in which the storage section is provided with a plurality of memory elements which are able to be written one time only and where information is held by changing resistance values in a non-written state and a written state.

19 Claims, 18 Drawing Sheets

MEMORY DEVICE, WRITING METHOD, AND READING METHOD

CROSS REFERENCE TO RELATED APPLICATIONS

This application claims the benefit of Japanese Priority Patent Application JP 2013-212960 filed Oct. 10, 2013, the entire contents of which are incorporated herein by reference.

BACKGROUND

The present technology relates to a memory device which is provided with a favorable storage element as a one-time programmable (OTP) element and to a reading method and a writing method with respect to such a memory device.

The OTP memory element is a non-volatile storage element which stores information even when a power source is turned off and various structures therefor such as fuse types and anti-fuse types have been proposed to date.

In a fuse type OTP element, for example, an information writing operation is performed by fusing a resistor by passing a large current with respect to a resistance element formed of polycrystal silicon or the like and changing a state between two electrodes from a short-circuited state to an open state.

On the other hand, in anti-fuse OTP elements, there are oxide film breakdown type elements which change a state between two electrodes from an open state to a short-circuited state by breaking down a dielectric body film by applying a dielectric breakdown voltage or more to a metal oxide semiconductor (MOS) type capacitor.

In addition, as anti-fuse OTP elements, there are elements which use the snap-back phenomenon of MOS transistors as illustrated in Japanese Unexamined Patent Application Publication (Translation of PCT Application) No. 2006-510203 described above. The snap-back phenomenon is a phenomenon where a strong pinch off force is forcibly generated and a large current flows between a source and a drain using a voltage which is lower than the breakdown voltage of a normal MOS transistor when a transistor is set to an on state by applying a predetermined voltage (a gate voltage) to a gate and then the gate voltage is lowered. In the OTP element of Japanese Unexamined Patent Application Publication (Translation of PCT Application) No. 2006-510203, a PN junction is broken by a large current which flows during the snap-back phenomenon and there is a short circuit between the source and the drain as a result. That is, even in the OTP element, the information writing operation is performed by changing the state between the two electrodes from the open state to the short-circuited state.

Furthermore, an anti-fuse element which uses an MOS shape as in Japanese Unexamined Patent Application Publication No. 2012-174864 is also in the related art. Japanese Unexamined Patent Application Publication No. 2012-174864 discloses an OTP element in which a filament made of metal is formed between the drain and the source by applying a voltage of a threshold or more between a drain and a source of an MOS, generating heat using a large current which flows when a bond is broken, and melting a metal material close to a heating section.

SUMMARY

OTP memory elements such as the fuse type or the anti-fuse type above vary the state of an element (from short-circuited to open or from open to short-circuited) using a large current which flows between two terminals which interpose the element. For this reason, it is necessary to arrange an OTP memory element and a selection transistor for reading/writing access on the current path and a memory cell is configured by directly connecting one OTP memory element with one selection transistor.

In such a case, it is necessary for the selection transistor to be able to pass a large current during writing and the size is increased. For example, in a case of passing a current of 30 mA, it is necessary for a W length of the selection transistor to be around 40 μm.

In addition, in memory elements in which writing is possible only once, it is only possible to express two states (one bit) of written and non-written in one memory cell (OTP element+selection transistor).

From the above, as the capacity of the number of bits is increased, the surface area of the memory cell array portion covers more area with respect to the macro surface area (the surface area of the entire memory device) than the surface area of the peripheral circuit portion, and the surface area of the memory element itself, the surface area of the selection transistor, and element isolation regions between each of the memory cells increase the macro surface area.

Therefore, the present technology makes it possible to increase the storage capacity and suppress the tendency for the surface area to increase, in other words, it is desirable to realize an OTP memory with a larger capacity with a small surface area.

First, according to an embodiment of the present technology there is provided a memory device including a memory cell which has one cell selection section and a storage section which is connected in series with respect to the cell selection section and which is selected as an access target for writing or reading by the cell selection section, in which the storage section is provided with a plurality of memory elements which are able to be written one time only and where information is held by changing resistance values in a non-written state and a written state.

By providing the plurality of memory elements in one storage section in this manner, it is possible to store a plurality of bits of information in one memory cell.

Second, in the memory device according to the present technology described above, the memory elements may have a first semiconductor layer formed of a first conductive type, in which a second semiconductor layer of a second conductive type and a third semiconductor layer of the second conductive type are separated, and writing may be performed by applying a voltage, which is equal to or greater than a threshold voltage at which filaments which link between the second semiconductor layer and the third semiconductor layer are formed, between the second semiconductor layer and the third semiconductor layer.

That is, each of the memory elements adopts a configuration where changes in the resistance value of the memory element are generated by the second semiconductor layer and the third semiconductor layer being short circuited (connected with low resistance) by a filament.

Third, in the memory device according to the present technology described above, it is desirable that the memory elements have a dielectric body film, which is formed to continue from an upper surface of the first semiconductor layer which separates the second semiconductor layer and the third semiconductor layer, a portion of an upper surface of the second semiconductor layer, and a portion of an upper surface of the third semiconductor layer, and a conductive body film which is formed on the dielectric body film.

Due to this, it is also possible to manufacture a memory element with the same processes as a so-called MOS transistor.

Fourth, in the memory device according to the present technology described above, it is desirable that the memory elements be MOS type elements where the first semiconductor layer is set as a well, one of the second semiconductor layer and the third semiconductor layer is set as a source or a drain, the dielectric body film is set as a gate oxide film, and the conductive film is set as a gate.

That is, an MOS transistor structure is adopted. Due to this, it is possible for the memory element to be controlled to be conductive or non-conductive in a non-written state.

Fifth, in the memory device according to the present technology described above, it is desirable that a silicide layer be formed on a portion of an upper section of the second semiconductor layer and a portion of an upper section of the third semiconductor layer.

For example, by providing a silicide layer which uses a metal with a high melting point, there is an advantage in forming filaments.

Sixth, in the memory device according to the present technology described above, the plurality of memory elements in the storage section may be connected with each other in series, and all or some of the plurality of memory elements may be configured such that it is possible to control conductivity or non-conductivity in a non-written state.

Due to this, writing is possible with respect to each of the plurality of memory elements. This is because, in a case of a series type where a plurality of memory elements are connected in series inside a storage section, it is possible to apply a potential difference to arbitrary memory elements and it is possible to write information thereto by making it possible to control some or all of the memory elements to be conductive or non-conductive and by also having a selection transistor function.

Seventh, in the memory device according to the present technology described above, it is desirable that, when one memory element out of the plurality of memory elements which are connected with each other in series in the storage section is set as a writing target and writing is performed, non-written memory elements other than the one memory element be controlled to be in a conductive state.

Since each of the memory elements is in series, by setting the non-written memory elements other than the writing target to a conductive state, it is possible to apply a potential difference in order to write to the memory element which is the writing target, for example, to apply a potential difference equal to or greater than a threshold at which a filament is formed.

Eighth, in the memory device according to the present technology described above, it is desirable that the plurality of memory elements which are connected with each other in series in the storage section each be formed with a transistor structure, and each of the memory elements be controlled using a voltage which is applied to a gate of each of the memory elements such that on resistances in a non-written state are resistance values which are different from each other.

In a case where the storage section is a series type, information is read out according to the series resistance values of the plurality of memory elements which are connected in series and the cell selection section. In such a case, it is possible for information values to be read out according to the written or non-written state of each of the memory elements by setting the on resistances to resistance values which are different from each other in a state where each of the memory element is non-written. For example, with a transistor structure, it is possible to control the on resistances according to the changes in the gate voltage.

Ninth, in the memory device according to the present technology described above, it is desirable that the plurality of memory elements which are connected with each other in series in the storage section each be formed with a transistor structure, and each of the memory elements be formed such that on resistances in a non-written state are resistance values which are different from each other due to gate lengths, densities of each of the semiconductor layers, and gate oxide film thicknesses being different from each other.

It is possible for information values to be read out according to the written or non-written state of each of the memory elements by setting the on resistances to be different from each other according to the gate lengths, the densities of each of the semiconductor layers, and gate oxide film thicknesses.

Tenth, in the memory device according to the present technology described above, the plurality of memory elements in the storage section may be connected with each other in parallel and may be each connected in series with the cell selection section.

In a case of a parallel type where the plurality of memory elements are connected with each other in parallel inside the storage section, by connecting each of the memory elements in series with the cell selection section, both writing and reading are possible by using the cell selection section with respect to each of the memory elements.

Eleventh, in the memory device according to the present technology described above, it is desirable that, when one memory element out of the plurality of memory elements which are connected with each other in parallel in the storage section is set as a writing target and writing is performed, for the memory elements other than the one memory element, a terminal on an opposite side to a series connection end with the cell selection section be controlled to be in an open state.

Since the potential difference which is applied to the storage section is not able to be applied with respect to the memory elements where the terminal on the opposite side described above is controlled to be in an open state, the writing is not able to be performed. In other words, it is possible to apply the potential difference to only the memory elements which are the writing target and which are not in an open state, for example, to apply a potential difference equal to or greater than a threshold at which filaments are formed.

Twelfth, in the memory device according to the present technology described above, it is desirable that, when one memory element out of the plurality of memory elements which are connected with each other in parallel in the storage section is set as a reading target and reading is performed, for the memory elements other than the one memory element, a terminal on an opposite side to a series connection end with the cell selection section be controlled to be in an open state.

Due to this, it is possible to observe a composite resistance value of an arbitrary memory element and the cell selection section.

Thirteenth, in the memory device according to the present technology described above, a plurality of series element sections may be provided in the storage section according to the plurality of memory elements which are connected with each other in series, each of the series element sections may be connected with each other in parallel and each is connected with the cell selection section in series, and some or all of the plurality of memory elements in each of the series element sections may be configured such that it is possible to control conductivity or non-conductivity in a non-written state.

That is, the above is a serial-to-parallel composite type where the series element section where the memory elements are connected in series are in parallel to each other. By each of the series element sections being connected with the cell selection section in series, both writing and reading are possible by using the cell selection section with respect to each of the series element sections. In addition, in the series element section, writing is possible to arbitrary memory elements by making it possible to control some or all of the memory elements to be conductive or non-conductive and by also having a selection transistor function.

Fourteenth, in the memory device according to the present technology described above, when a memory element of one series element section out of the plurality of series element sections which are connected with each other in parallel in the storage section is set as a writing target and writing is performed, for the series element sections other than the one series element section, a terminal on an opposite side to a series connection end with the cell selection section may be controlled to be in an open state and non-written memory elements in the one series element section other than the memory element which is the writing target may be controlled to be a conductive state.

Since the potential difference which is applied to the storage section is not able to be applied with respect to the series element sections where the terminal on the opposite side described above is controlled to be in an open state, the writing is not able to be performed. In other words, it is possible to apply the potential difference to only the series element section which includes the memory element which is the writing target and which is not set to the open state. In such a series element section, by setting the non-written memory elements other than the writing target to a conductive state, it is possible to apply a potential difference in order to write to the memory element which is the writing target, for example, to apply a potential difference equal to or greater than a threshold at which a filament is formed.

Fifteenth, in the memory device according to the present technology described above, when one series element section out of the plurality of series element sections which are connected with each other in parallel in the storage section is set as a reading target and reading is performed, for the series element sections other than the one series element section, a terminal on an opposite side to a series connection end with the cell selection section may be controlled to be in an open state.

Due to this, it is possible to observe a composite resistance value of an arbitrary memory element and the cell selection section.

Sixteenth, in the memory device according to the present technology described above, it is desirable that the cell selection section be formed by a cell selection transistor, the plurality of memory elements in storage section each be formed with a transistor structure, and the cell selection transistor and each of the memory elements be formed on the same active region.

Due to this, it is possible to realize a memory device with a structure which is easily formed.

Seventeenth, in the memory device according to the present technology described above, it is desirable that the cell selection section be formed by a cell selection transistor, the plurality of memory elements in storage section each be formed with a transistor structure, and the gate length of the cell selection transistor be larger than the gate lengths of each of the memory elements.

This is because it is necessary for the cell selection transistor to pass a comparatively large current.

According to another embodiment of the present technology, there is provided a method for writing information with respect to a memory device which is provided with a memory cell which has one cell selection section and a storage section which is connected in series with respect to the cell selection section and which is selected as an access target for writing or reading by the cell selection section, in which the storage section is provided with a plurality of memory elements which are able to be written one time and where information is held by changing resistance values in a non-written state and a written state. Then, the method includes applying a predetermined potential difference or more to both ends of one memory element in the storage section of the memory cell which is the writing target by controlling the cell selection section of the memory cell which is a writing target to be in an on state using a word line which corresponds to the memory cell which is the writing target out of a plurality of word lines which are arranged with respect to a memory cell array where the memory cells are arranged in a shape of a matrix and applying a voltage using a bit line which corresponds to the memory cell which is the writing target out of a plurality of bit lines which are arranged with respect to the memory cell array, and writing to the one memory element.

By applying a predetermined potential difference or more to the memory element which is the writing target with respect to a plurality of memory elements of a storage section as a series type, a parallel type, or a complex type, it is possible to appropriately write to memory cells which are able to store multiple values as a plurality of bits.

According to still another embodiment of the present technology, there is provided a method for reading information with respect to a memory device which is provided with a memory cell which has one cell selection section and a storage section which is connected in series with respect to the cell selection section and which is selected as an access target for writing or reading by the cell selection section, in which the storage section is provided with a plurality of memory elements which are able to be written one time and where information is held by changing resistance values in a non-written state and a written state.

Then, the method includes reading information which is stored in the memory elements in the storage section by detecting a composite resistance value of the cell selection section and the storage section by controlling the cell selection section of the memory cell which is a reading target to be an on state using a word line which corresponds to the memory cell which is the reading target out of a plurality of word lines which are arranged with respect to a memory cell array where the memory cells are arranged in a shape of a matrix, and applying a voltage to the cell selection section of the memory cell which is the reading target and the storage section using a bit line which corresponds to the memory cell which is the reading target out of a plurality of bit lines which are arranged with respect to the memory cell array.

By detecting a resistance value of the memory cell which is the reading target with respect to a plurality of memory elements of a storage section as a series type, a parallel type, or a complex type, it is possible to appropriately read information which is stored in a storage section which is able to store multiple values as a plurality of bits.

According to the embodiments of the present technology, it is possible to for one memory cell to store a plurality of bits of information by providing a plurality of memory elements in one storage section. Due to this, even when the storage capacity is increased, it is possible to suppress the tendency for the surface area of the memory cell array to increase and to realize a memory device with a larger capacity with a small surface area.

Here, the effects described herein are not limiting and may be any one of the effects described in the present technology.

DETAILED DESCRIPTION OF EMBODIMENTS

Figure 1A:
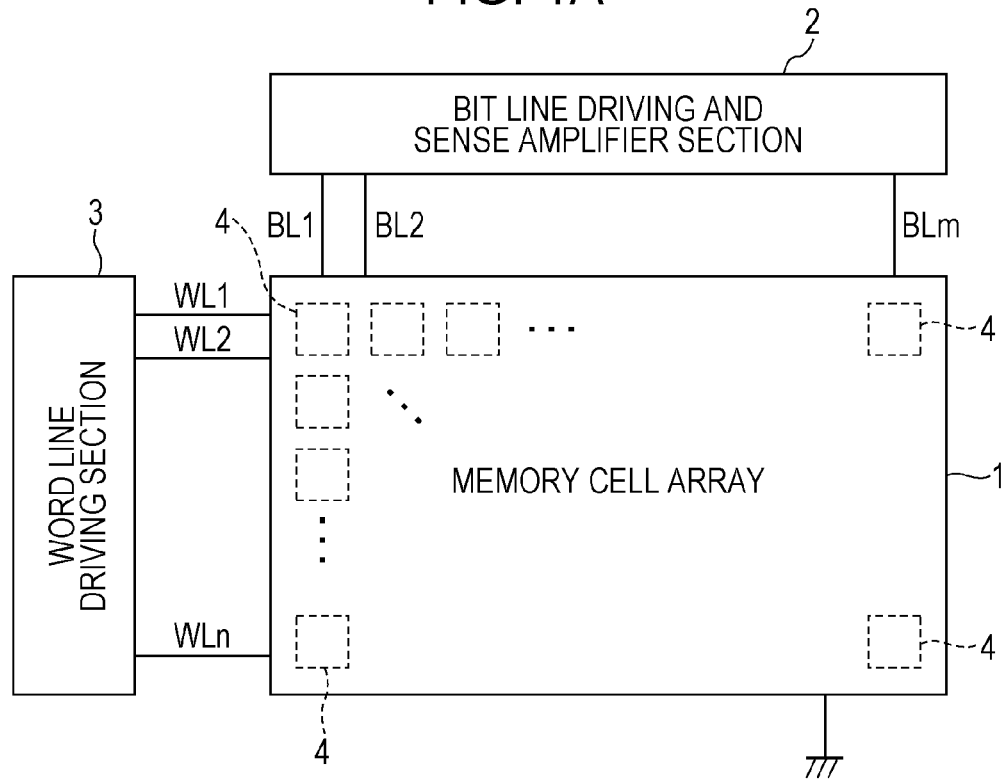
FIGS. 1A and 1B are block diagrams of a memory device of an embodiment of the present technology.

Below, embodiments will be described in the following order.
1. Memory Device Configuration
2. Memory Cell Configuration
3. First Embodiment
4. Second Embodiment
5. Third Embodiment
6. Fourth Embodiment
7. Fifth Embodiment
8. Sixth Embodiment
9. Summary and Modification Examples 1. Memory Device Configuration FIG. 1A illustrates a block configuration of a memory device according to an embodiment.

The memory device of the present embodiment is a so-called OTP-ROM (Read Only Memory) which is limited to being able to write information (data) one time only, is able to read out the information which is written many times, and is not able to perform deletion of the information.

The memory device is provided with a memory cell array 1 which has a plurality of memory cells 4, a word line driving section 3, and a bit line driving sense amplifier section 2.

The plurality of memory cells 4 are arranged in the form of rows and columns (a matrix shape) in the memory cell array 1.

One (or in some cases, a plurality) word line WL and one bit line BL are connected with respect to each of the memory cells 4 in the memory cell array 1.

A word line driving section 3 applies a predetermined word line potential with respect to a plurality of word lines WL1 to WLn which are arranged in parallel to a row direction. n is an integer of two or more.

Each of the word lines WL1 to WLn is arranged in common with respect to the memory cells 4 which are each lined up in the row direction.

A cell selection section 100 (a cell selection transistor 10), which will be described below, in each of the memory cells 4 is controlled according to a word line potential which is applied to the word lines WL1 to WLn. In addition, there are also cases where memory elements inside the memory cell 4 are controlled to be on (conductive) or off (non-conductive) according to the word line potential.

Here, "word lines WL" is appropriately used below as a general term for the word lines WL1 to WLn.

A bit line driving sense amplifier section 2 applies a predetermined potential with respect to a plurality of bit lines BL1 to BLm which are arranged in parallel to a column direction. m is an integer of two or more.

Each of the bit lines BL1 to BLm is arranged in common with respect to the memory cells 4 which are each lined up in a column direction.

An information writing operation which will be described below is carried out by applying a predetermined voltage with respect to a memory element 20, which will be described below, inside the memory cell 4 using the bit line driving sense amplifier section 2.

The bit line driving sense amplifier section 2 also has an additional function of performing an operation for reading information from each of the memory cells 4 using m of the bit lines BL1 to BLm and of performing a predetermined signal amplification process in a sense amplifier inside the bit line driving sense amplifier section 2.

Here, "bit lines BL" is appropriately used below as a general term for the bit lines BL1 to BLm.

Writing or reading information is performed by selecting the memory cell 4 (the memory element 20, which will be described below, in the memory cell 4) which is an access target for writing or reading from the plurality of memory cells 4 inside the memory cell array 1 according to driving of the word lines WL by the word line driving section 3 and driving of the bit lines BL by the bit line driving sense amplifier section 2.

Figure 1B:
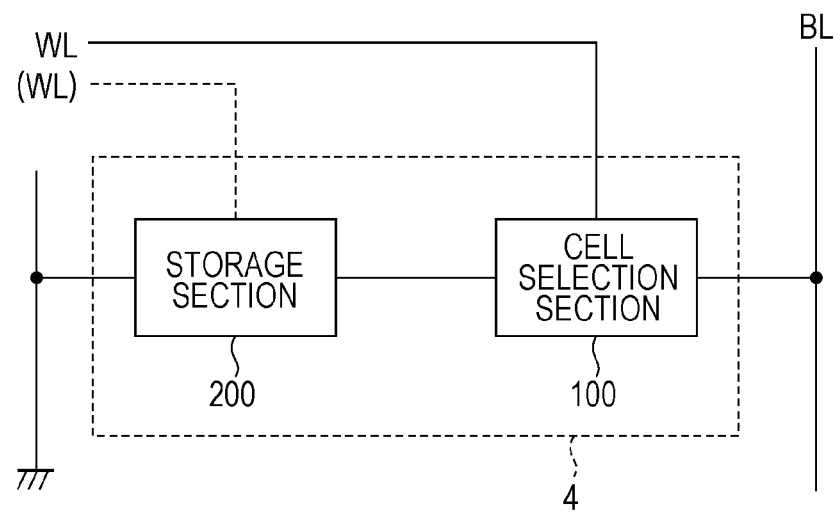

FIG. 1B illustrates a configuration inside the memory cell 4.

One memory cell 4 has one cell selection section 100 and a storage section 200 which is connected in series with respect to the cell selection section 100 and is selected as an access target for writing or reading by the cell selection section 100.

Detailed description will be given below; however, a plurality of memory elements 20, which are able to be written one time only and where information is held by changing resistance values in a non-written state and a written state, are provided in the storage section 200.

The cell selection section 100 and the storage section 200 are connected in series between the bit lines BL and the ground. A current path via the storage section 200 is formed by the cell selection section 100 being turned on due to the application of a voltage by the word lines WL. In other words, the storage section 200 is in a state of being selected as an access target.

Here, there are times when the word lines WL which are illustrated with a dashed line are used in order to select one out of a plurality of memory elements inside the storage section 200 as a writing target.

Here, description will be given of a comparative example with respect to the present embodiment.

Figure 2A:
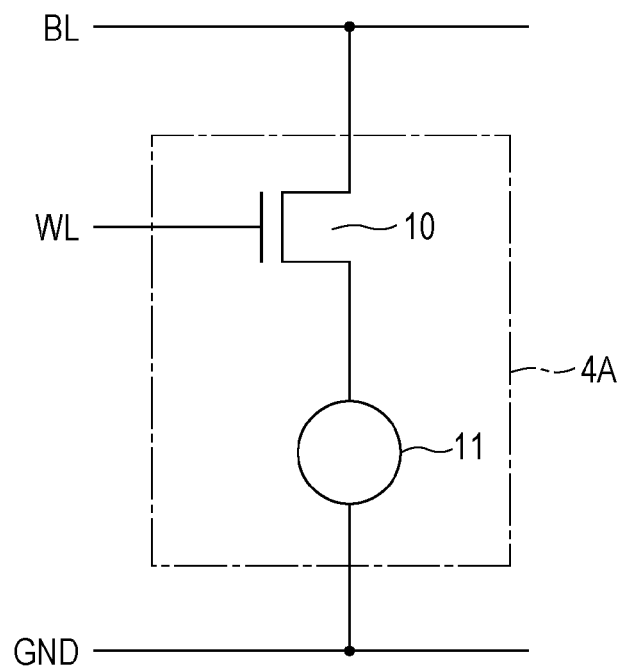
FIGS. 2A and 2B are explanatory diagrams of an equivalent circuit of memory cells in a comparative example and a surface area tendency.

FIG. 2A illustrates an equivalent circuit of a memory cell 4A as a comparative example. As illustrated in the diagram, the cell selection transistor 10 which is equivalent to the cell selection section 100 and one memory element 11 as a site which is equivalent to the storage section 200 are connected in series between the bit lines BL and the ground (GND). As described above, for OTP memory elements such as fuse type elements or anti-fuse type elements, since the state of the elements varies due to a large current which flows between two terminals which interpose the memory element, the OTP memory elements 11 and the cell selection transistor 10 are arranged on the current path.

However, since the cell selection transistor 10 may have a large size in order to handle a large current and there is one bit storage in the series circuit, the tendency for the macro surface area to increase due to the increase of the memory cell surface area is increased when the capacity is increased. For example, the inclination, which illustrates the relationship between the number of the bits and the macro surface area, is large as illustrated with a solid line in FIG. 2B.

Figure 2B:
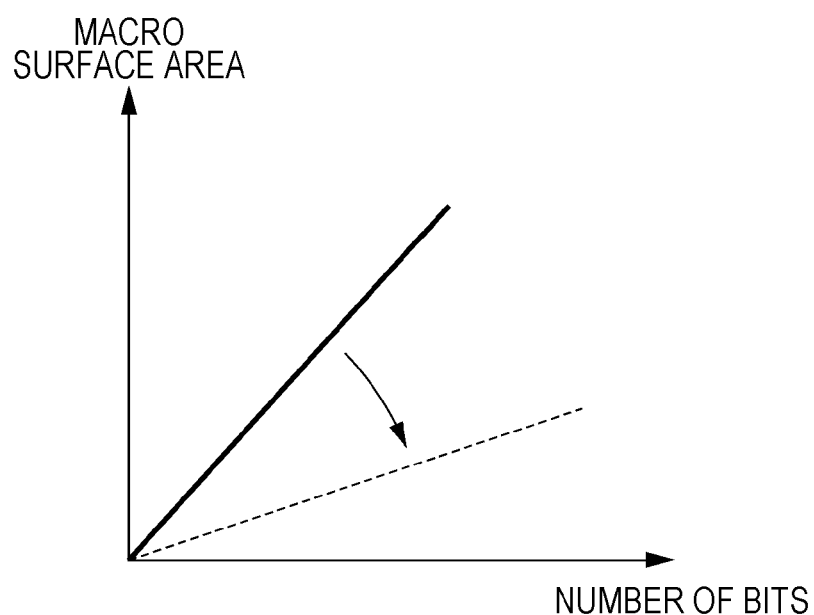

In the present embodiment, making the inclination smaller may be considered as illustrated with a dashed line in FIG. 2B. That is, the present embodiment aims to suppress the tendency for the macro surface area to increase even when the storage capacity is increased.

Therefore, the present embodiment aims to make it possible to store information with numerous bits using one memory cell 4. That is, multiplexing is realized by providing a plurality of memory elements which are connected in series with respect to the individual cell selection transistor 10, the number of memory cells is reduced even though the number of bits is the same since a plurality of bits of information are put in one memory cell 4, and the increase in the surface area of the memory cell array 1 as a whole is suppressed.

2. Memory Cell Configuration

In the present embodiment described above, the memory cell 4 is provided with a plurality of memory elements. That is, the storage section 200 illustrated in FIG. 1B has a plurality of memory elements and due to this, storing information with numerous bits is possible.

Figure 3A:
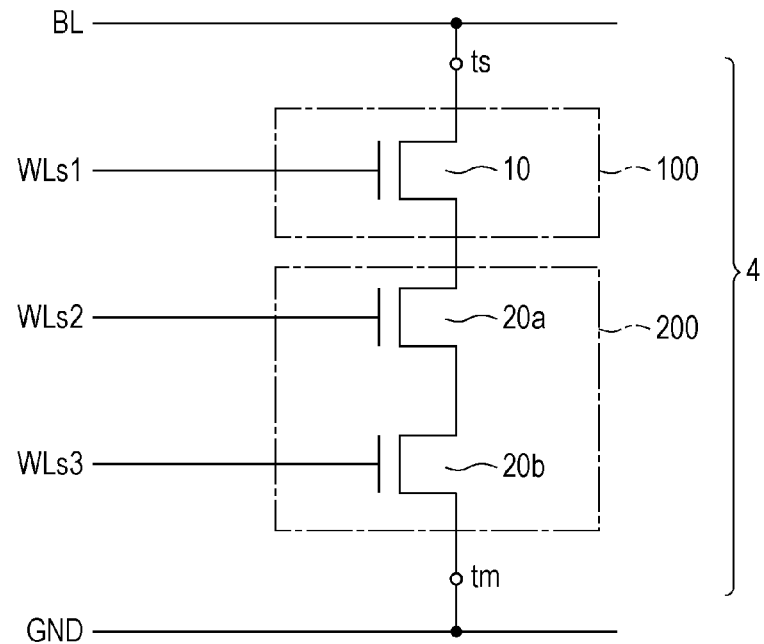
FIGS. 3A and 3B are an equivalent circuit diagram of a series type memory cell of an embodiment.
Figure 3B:
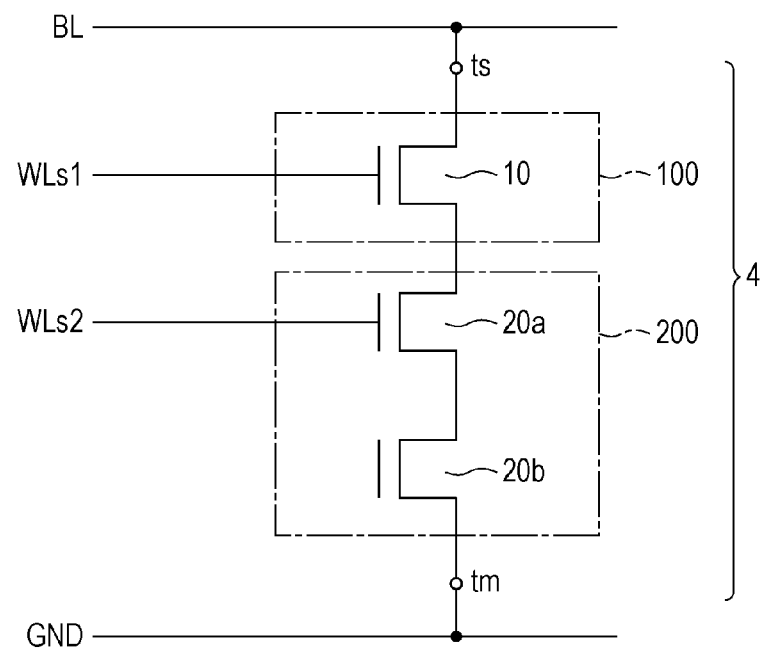
Figure 4:
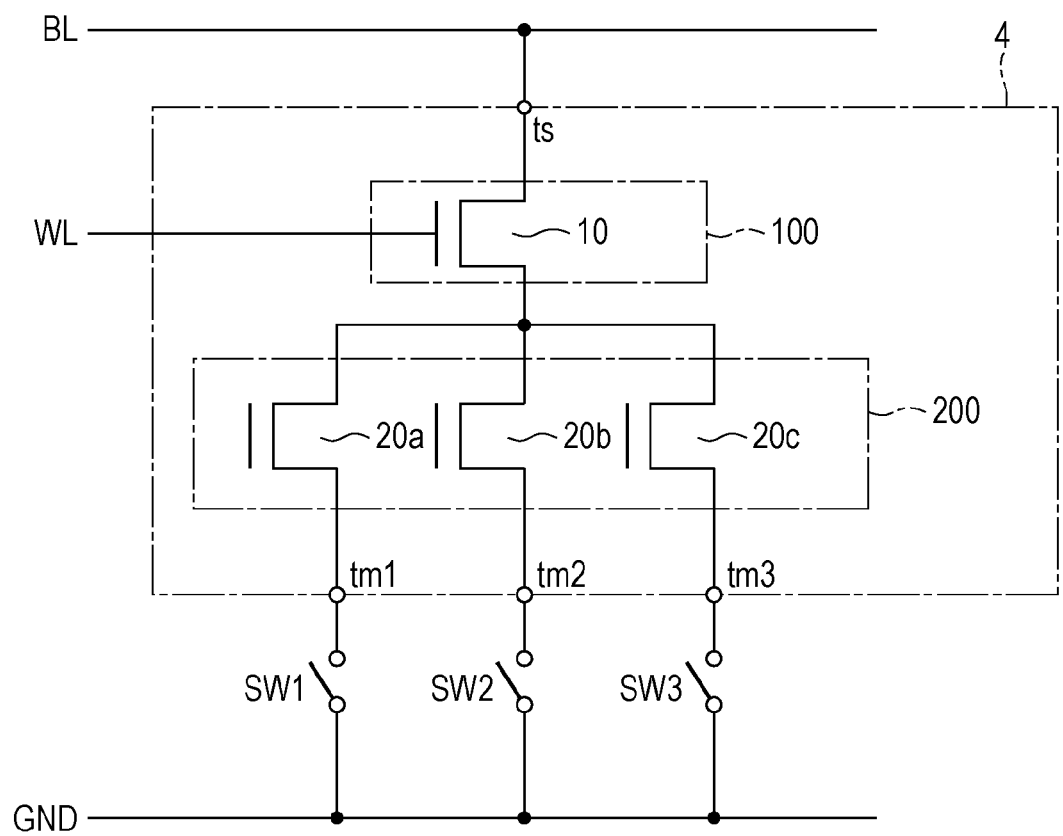
FIG. 4 is an equivalent circuit diagram of a parallel type memory cell of an embodiment.

An equivalent circuit of the memory cell 4 in the memory device of the embodiment is illustrated in FIGS. 3A and 3B, and FIG. 4.

Here, below, regarding the memory cell 4, a connection terminal with the bit lines BL side is a terminal ts and a connection terminal with the ground side is a terminal tm.

In addition, the diagrams illustrate memory elements 20a, 20b, and the like; however, these are described as "memory elements 20" as a general term.

Firstly, FIG. 3A illustrates a configuration example which has a plurality (two in this example) of memory elements 20a and 20b in the storage section 200. The memory elements 20a and 20b are connected with each other in series. A type where a plurality of memory elements are connected in series inside the storage section 200 is referred to as a "series type" in the explanation.

The cell selection section 100 is configured with the cell selection transistor 10 which selects the memory cell as an access target.

The memory elements 20a and 20b are each elements of a transistor structure.

The cell selection transistor 10 and the memory elements 20a and 20b are formed of, for example, Metal Oxide Semiconductors (MOS) transistors. However, these are not limited to this and transistors with another structure may be used.

Then, as illustrated in the diagram, the cell selection transistor 10 and the memory elements 20a and 20b are connected in series between the source and the drain between the terminal ts and the terminal tm.

A word line WLs1 is connected with a gate of the cell selection transistor 10. Accordingly, writing or reading is performed by the storage section 200 of the memory cell 4 being selected as an access target by the word line driving section 3 turning on the cell selection transistor 10 due to the application of a voltage to the word line WLs1 and the bit line driving sense amplifier section 2 further applying a voltage to the bit lines BL.

Here, regarding the memory elements 20a and 20b which are connected with each other in series, the word lines WLs2 and WLs3 are respectively connected with each of the gates. Description will be given below; however, the configuration is able to control each of the memory elements 20a and 20b in a non-written state to be in an on state by the word line driving section 3 applying a predetermined voltage to the word lines WLs2 and WLs3. Detailed description will be given below; however, controlling memory elements 20a and 20b in a non-written state to be on/off is one method for performing writing with respect to a specific memory element (either one of the memory elements 20a or 20b) in a case of a series type.

FIG. 3B is different from FIG. 3A in the point that the gate on a memory element 20 side is not connected with the word line WLs3. There are also cases where not all of the memory elements inside the storage section 200 have to be controlled to be on/off. In such a case, the configuration in FIG. 3B may be adopted.

The memory elements 21 are elements which have a source and a drain as a transistor structure; however, a gate structure may or may not be provided.

FIG. 4 is a configuration example which has a plurality (three in this example) of memory elements 20a, 20b, and 20c in the storage section 200 and the memory elements 20a, 20b, and 20c are connected with each other in parallel. A type where a plurality of memory elements are connected in parallel inside the storage section 200 is referred to as a "parallel type" in the explanation.

The cell selection section 100 is configured with the cell selection transistor 10 (for example, an MOS transistor) which selects the memory cell as an access target.

Each of the memory elements 20a, 20b, and 20c is an element which has a source and a drain as a transistor structure; however, a gate structure is not typically necessary (the gate structure may be provided).

The memory elements 20a, 20b, and 20c are each connected with the cell selection transistor 10 in series.

The word lines WL are connected with the gate of the cell selection transistor 10. Accordingly, writing or reading is performed by the storage section 200 of the memory cell 4 being selected as an access target by the word line driving section 3 turning on the cell selection transistor 10 due to the application of a voltage to the word lines WL and the bit line driving sense amplifier section 2 further applying a voltage to the bit lines BL.

In such a case, terminals tm1, tm2, and tm3 are provided as terminals of the memory elements 20a, 20b, and 20c on an opposite side to the cell selection transistor 10.

As an example, switches SW1, SW2, and SW3 are provided between the terminals tm1, tm2, and tm3 and the ground (GND) and each of the terminals tm1, tm2, and tm3 is able to be in a state of either open/grounded according to each of the switches SW1, SW2, and SW3. Detailed description will be given below; however, making a configuration where it is possible to set the terminals tm1, tm2, and tm3 to an open state is one method for performing writing or reading with respect to a specific memory element (any one of the memory elements 20a, 20b, or 20c) inside the storage section 200 in a case of a parallel type.

Subsequently, a specific configuration example will be illustrated in FIGS. 5A and 5B, FIGS. 6A and 6B, and FIGS. 7A and 7B as the memory elements 20 (for example, the memory elements 20a, 20b, and the like) which are provided in the storage section 200. Here, in FIGS. 5A and 5B, FIGS. 6A and 6B, and FIGS. 7A and 7B and in the description of each of the embodiments which will be described below, the letters "N" and "P" which indicate an N type and a P type are added for convenience to the reference numerals for the semiconductor layer in the diagrams; however, there is no problem even with structures where the N type and the P type are reversed and the structure is not limited to the conductive type illustrated in the diagram. In the example below, an NMOS base structure will be the focus of the description; however, the structure may be a PMOS base structure and is not limited to the NMOS base structure.

Figure 5A:
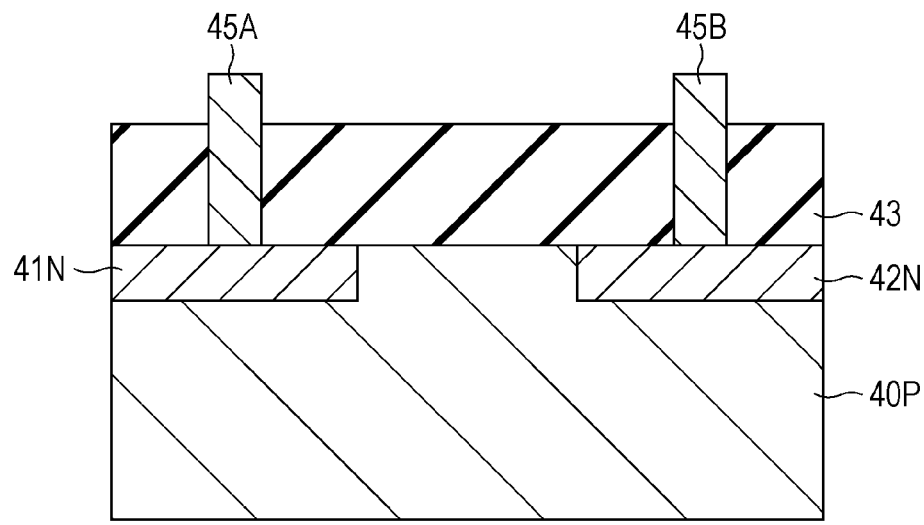
FIGS. 5A and 5B are explanatory diagrams of a memory element structure of an embodiment.
Figure 5B:
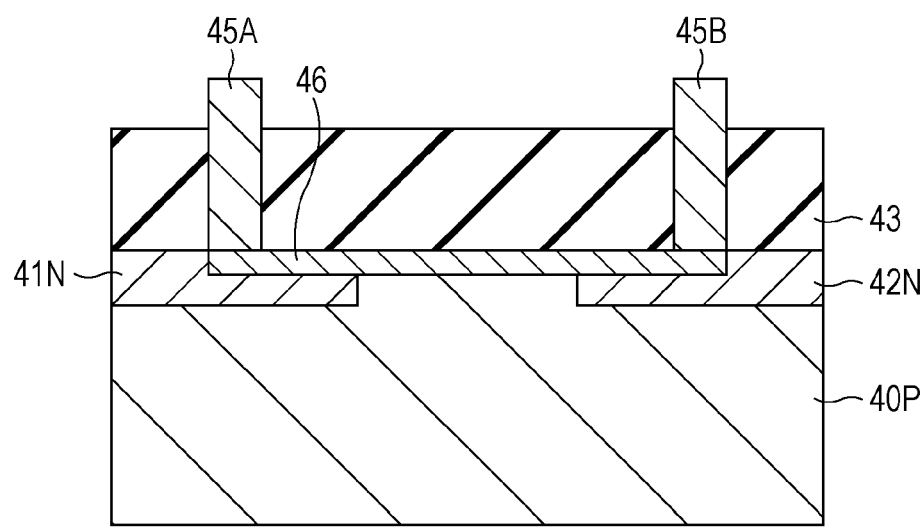
Figure 6A:
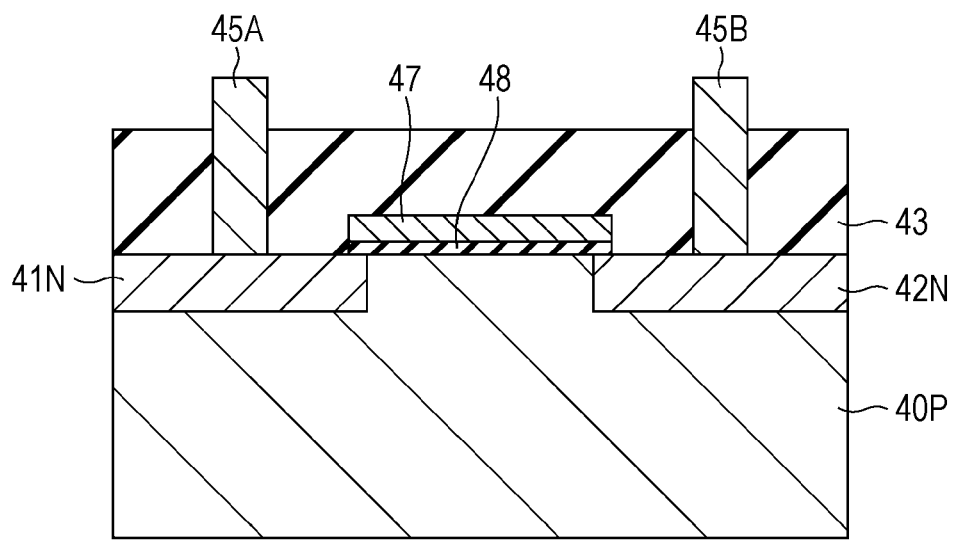
FIGS. 6A and 6B are explanatory diagrams of a memory element structure of an embodiment.
Figure 6B:
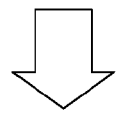
Figure 6B:
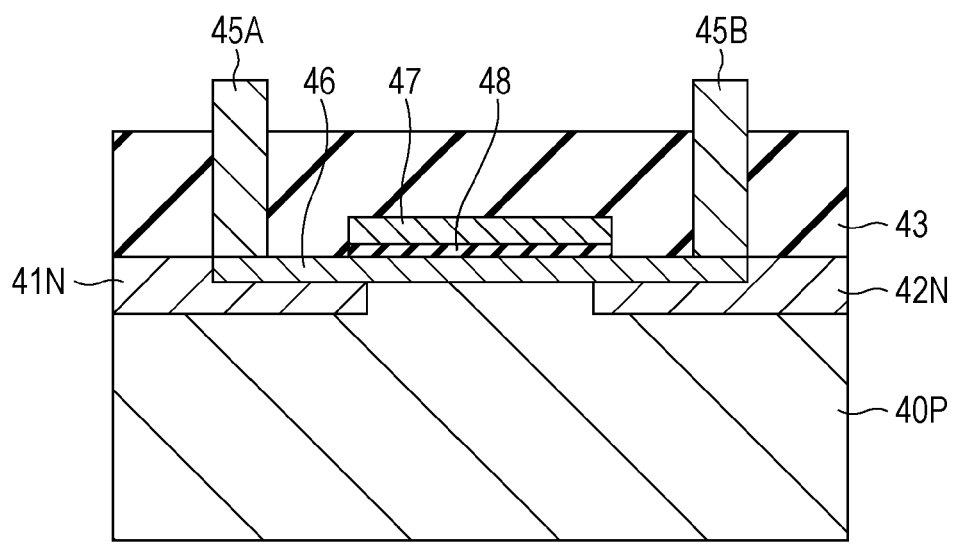
Figure 7A:
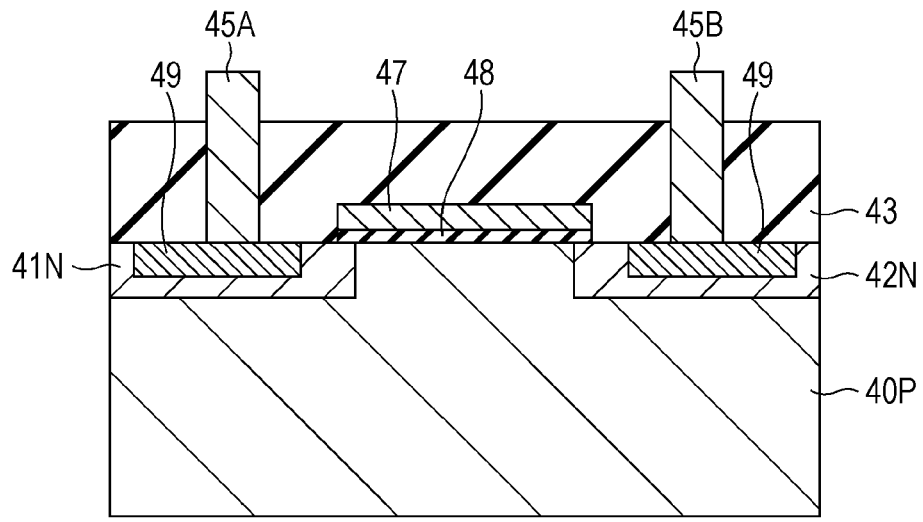
FIGS. 7A and 7B are explanatory diagrams of a memory element structure of an embodiment.
Figure 7A:
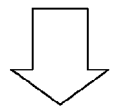
Figure 7B:
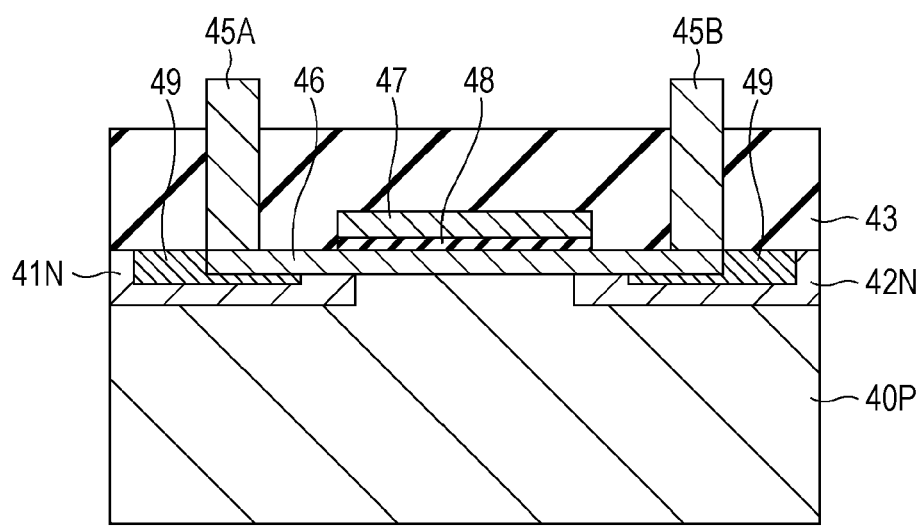

FIGS. 5A, 6A, and 7A each illustrate a surface area structure before a writing operation as a structural example of the memory elements 20 as an anti-fuse type OTP which is used in the present embodiment and FIG. 5B, FIG. 6B, and FIG. 7B illustrate a cross-sectional structure after the writing operation.

Firstly, the example in FIGS. 5A and 5B will be described.

As illustrated in FIG. 5A, the memory element 20 before a writing operation has a laminated structure formed of semiconductor layers 40P, 41N, and 42N, a pair of electrodes 45A and 45B, and an insulation layer 43.

The semiconductor layer 40P (a first semiconductor layer), for example, configures a semiconductor substrate and is a P type (a first conductive type) semiconductor layer. The semiconductor layer 40P is formed of, for example, a semiconductor material where impurities such as boron (B) are doped into silicon (Si) or the like.

The semiconductor layer 41N (a second semiconductor layer) and the semiconductor layer 42N (a third semiconductor layer) are arranged so as to be separated from each other leaving predetermined intervals from each other in the semiconductor layer 40P and are formed of an N type (a second conductive type) semiconductor layer (configuring a so-called N+ layer).

The semiconductor layers 41N and 42N are each formed of, for example, a semiconductor material where impurities such as arsenic (As) or phosphorus (P) are doped into Si or the like and the thickness is approximately 50 to 200 nm. It is possible to easily form such semiconductor layers 41N and 42N in the region of the semiconductor layer 40P using a mask pattern such as a predetermined photoresist, an oxide film, or the like.

Here, it is desirable to make the distance between the semiconductor layers 41N and 42N as short as possible (for example, approximately 50 to 200 nm). This is because there is an advantage in realizing the memory element 20 where the element size is small.

The insulation layer 43 is provided so as to cover the semiconductor layers 40P, 41N, and 42N. The insulation layer 43 is formed of, for example, an insulation material such as silicon oxide ($SiO_2$), silicon nitride ($SiN_x$), or the like and the thickness is approximately 50 to 1000 nm.

The electrode 45A is provided on the semiconductor layer 41N in the insulation layer 43 so as to be electrically connected with the semiconductor layer 41N and it is possible to apply a predetermined potential with respect to the semiconductor layer 41N using the electrode 45A.

The electrode 45B is provided on the semiconductor layer 42N in the insulation layer 43 so as to be electrically connected with the semiconductor layer 42N and it is possible to apply a predetermined potential with respect to the semiconductor layer 42N using the electrode 45B.

These electrodes 45A and 45B are each formed of conductive materials such as metals such as, for example, tungsten (W), aluminum (Al), or the like.

On the other hand, as illustrated in FIG. 5B, in the memory element 20 after a writing operation, a filament 46 (a conductive path section) which will be described below is formed in addition to the semiconductor layers 40P, 41N, and 42N, the electrodes 45A and 45B, and the insulation layer 43 described above.

The filament 46 is formed in the region between the semiconductor layers 41N and 42N via the semiconductor layer 40P and functions as a conductive path which electrically connects the semiconductor layers 41N and 42N (the electrodes 45A and 45B).

In other words, in the memory element 20 illustrated in FIG. 5B, there is a short circuit (a short-circuited state) with a predetermined resistance value (by a resistance component) between the semiconductor layers 41N and 42N due to the filament 46.

The filament 46 is formed according to the following principle.

In the structure in FIG. 5A, by applying a predetermined voltage or more between the two semiconductor layers 41N and 42N, a large current flows between the two semiconductor layers 41N and 42N in the same manner as the phenomenon of separation pressure resistance destruction between collector emitters seen in normal bipolar transistors or the like. Due to migration due to the current which flows at this time, as illustrated in FIG. 5B, the metal filament 46 made of metal or the like is formed in the electrodes 45A and 45B and there is a short circuit between the two semiconductor layers 41N and 42N with a certain resistance value.

In the present embodiment, this phenomenon is expressed as "writing". That is, in a non-written state where the writing described above is not carried out (information is not written) in the memory element 20 of the present embodiment, as illustrated in FIG. 5A, the memory element 20 is in an open state where the semiconductor layers 41N and 42N are electrically separated from each other. On the other hand, in the memory element 20 after writing (information is written), as illustrated in FIG. 5B, the memory element 20 is in a state where the semiconductor layers 41N and 42N are electrically connected with each other (in a short-circuited state) by a resistance component due to the forming of the filament 46.

Accordingly, the memory element 20 functions as an anti-fuse type OTP element.

In a case of forming the structure, it is desirable to shorten the separation distance of the two semiconductor layers 41N and 42N and as a result, it is possible to realize the memory element 20 where the threshold of a writing voltage is small and the element size is small.

Here, since a minute leak current flows in practice in an "open state" before the writing described above, strictly speaking, the open state is not a completely open state. However, since the difference in the current which flows between the semiconductor layers 41N and 42N is large before writing (before forming the filament 46) and after writing (after forming the filament 46), it is possible to differentiate and detect these states before and after the operation. In other words, information is stored as a difference between resistance values.

In addition, the structure of the memory element 20 illustrated in FIG. 5A is able to be easily formed using the same method as the forming process of general MOS transistors (for example, a self-alignment source and drain forming process (a self-alignment type) where a gate of an MOS transistor is a mask). In such a case, it is possible to form the structure such that the distance between the semiconductor layers 41N and 42N which are separated from each other is short and it is possible to form the structure such that the ease of controlling of the size is also favorable.

Next, the example in FIGS. 6A and 6B will be described.

As illustrated in FIGS. 6A and 6B, whether or not there is the filament 46 is different before and after a writing operation is the same as in FIGS. 5A and 5B. In such a case, in the structure illustrated in FIGS. 5A and 5B, a dielectric body film 48 and a conductive body film 47 are provided in this order in the region which corresponds to between the semiconductor layers 41N and 42N. The configuration is otherwise the same as in FIGS. 5A and 5B.

In detail, the dielectric body film 48 is formed to continue from an upper surface of the semiconductor layer 40P which separates the semiconductor layer 41N and the semiconductor layer 42N, a portion of an upper surface of the semiconductor layer 41N, and a portion of an upper surface of the semiconductor layer 42N, and the conductive body film 47 is formed on the dielectric body film 48.

The dielectric body film 48 is formed of, for example, an insulation material (a dielectric body) such as $SiO_2$ and the thickness is several nm to approximately 20 nm.

The conductive body film 47 is provided on the forming region of the dielectric body film 48 and due to this, a laminated structure formed of the dielectric body film 48 on the lower layer side and the conductive body film 47 on the upper layer side is formed. The conductive body film 47 is formed of, for example, a conductive material such as polycrystal silicon or silicide metal and the thickness is approximately 50 to 500 nm.

In a case of the structure in FIGS. 6A and 6B, there is a configuration as an MOS transistor element where the semiconductor layer 40P is set as a well, the semiconductor layers 41N and 42N are set as a source or a drain, the dielectric body film 48 is set as a gate oxide film, and the conductive body film 47 is set as a gate.

Accordingly, it is possible to easily form the structure in FIGS. 6A and 6B in the integrated circuit where the MOS transistor is used without an increase in the number of processes.

As described above, in a case of a configuration which makes it possible to control the memory element 20 in a non-written state to be on/off, an electrode for applying a potential to each of the conductive body film 47 and the semiconductor layer 40P is formed. For example, there is the case of the memory elements 20a and 20b in FIG. 3A.

On the other hand, for example, in the cases of the memory element 20b in a case of adopting the circuit configuration in FIG. 3B or of the memory elements 20a, 20b, and 20c in a case of a parallel type in FIG. 4, the on/off control is not typically necessary. The memory element 20 in such a case may have the structure in FIGS. 5A and 5B, or may be set to float in the structure in FIGS. 6A and 6B where an electrode is formed or not formed in the conductive body film 47.

In a case where the conductive body film 47 is not used as a gate of a transistor, the gate length of the memory element 20 is regulated to be the distance between the semiconductor layers 41N and 42N which are separated from each other; however, it is not necessary to set the gate length to the smallest value (a value which is determined by rating or the like) as an MOS transistor. That is, as long as the semiconductor layers 41N and 42N are separated, it is not necessary to form the semiconductor layers 41N and 42N with the smallest gate length or less as an MOS transistor.

In FIGS. 7A and 7B, a silicide layer 49 is provided in the semiconductor layers 41N and 42N in addition to the structure described in FIGS. 6A and 6B.

It is possible to form the filament 46 which is stable at a lower voltage when the silicide layer 49 is formed in a portion of the two semiconductor layers 41N and 42N by a silicide process which uses a high melting point metal such as cobalt or nickel which is normally used and the electrodes 45A and 45B are formed on the upper portion of the silicide layer 49.

The memory element 20 of the present embodiment is formed using the structure described in FIGS. 5A and 5B, FIGS. 6A and 6B, and FIGS. 7A and 7B. In the present embodiment, multiplexing is realized in the memory cell by forming a plurality of the memory elements 20 on the same active region in series or in parallel and forming the memory elements 20 in series with an individual cell selection transistor 10.

In particular, since it is possible to realize the memory element 20 of the embodiment within the process range of a normal CMOS process, there is also a great advantage in terms of wafer cost.

Here, in a case of the structure in FIGS. 6A and 6B and FIGS. 7A and 7B, it is desirable that the width of the conductive body film 47 (the length in a direction which straddles the semiconductor layers 41N and 42N) which is equivalent to the gate of the MOS transistor in the memory element 20 be narrower than the gate length L of the cell selection transistor 10 formed of a MOS transistor. Due to this, it is possible to make it easier to form the filament 46 in a direction where separation pressure resistance between the semiconductor layers 41N and 42N is reduced and as a result, it is possible to suppress a voltage decrease during the writing operation to the memory element 20.

3. First Embodiment

Below, specific configuration examples as multi-value memory cells will be described as first to sixth embodiments.

In each of the embodiments, description will be given using the example which uses the structure in FIGS. 6A and 6B as the memory element 20; however, it is possible to appropriately use the memory element 20 with the structure in FIGS. 5A and 5B or FIGS. 7A and 7B.

Figure 8A:
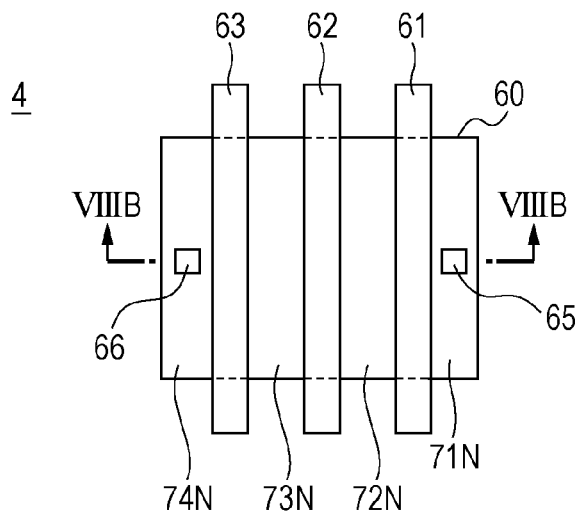
FIGS. 8A to 8C are explanatory diagrams of a memory cell of a first embodiment.
Figure 8B:
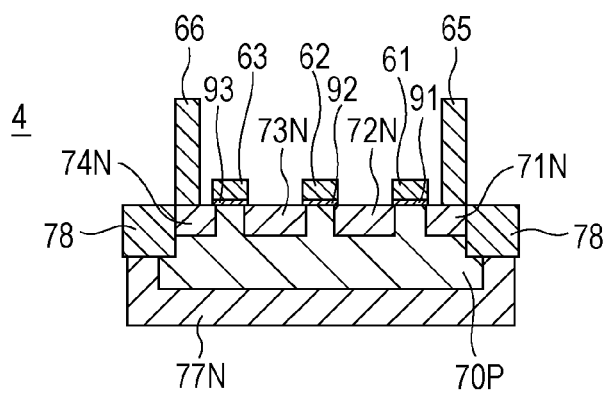
Figure 8C:
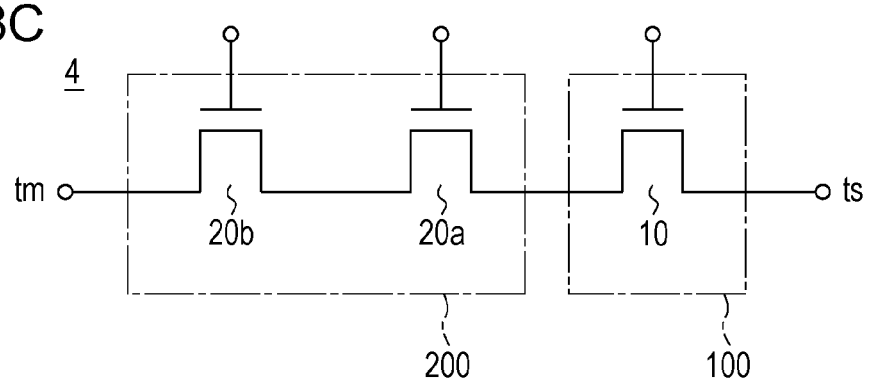

The structure of the memory cell 4 is illustrated in FIGS. 8A to 8C as a first embodiment. FIG. 8A is a planar diagram of the memory cell 4, FIG. 8B is a cross-sectional diagram of VIIIB-VIIIB' in FIG. 8A, and FIG. 8C is an equivalent circuit diagram.

FIGS. 8A and 8B illustrate an active region 60, conductive body films 61, 62, and 63, electrodes 65 and 66, a P type semiconductor layer 70P, N type semiconductor layers 71N, 72N, 73N, 74N, and 77N, an element separation region 78, and dielectric body films 91, 92, and 93.

Due to these, the cell selection transistor 10 and the memory elements 20a and 20b are formed on the same active region (an activation region) 60.

In detail, four N type semiconductor layers 71N, 72N, 73N, and 74N are formed in the P type semiconductor layer 70P. Dielectric body films 91, 92, and 93 and conductive body films 61, 62, and 63 are respectively formed in the regions which correspond to between the semiconductor layers 71N and 72N, between 72N and 73N, and between 73N and 74N on the semiconductor layer 70P.

The electrode 65 which is electrically connected with the semiconductor layer 71N is formed in the semiconductor layer 71N and the electrode 66 which is electrically connected with the semiconductor layer 74N is formed in the semiconductor layer 74N. The electrode 65 configures, for example, a terminal ts on a side which is connected with the bit lines BL. The electrode 66 configures, for example, a terminal tm which is connected with the ground side.

The memory cell 4 has an enclosed N configuration which covers the semiconductor layer 70P with the semiconductor layer 77N and electrically separates the semiconductor layer 70P from a substrate.

The cell selection transistor 10 is configured by the semiconductor layers 71N and 72N, the dielectric body film 91, and the conductive body film 61.

The memory element 20a is configured by the semiconductor layers 72N and 73N, the dielectric body film 92, and the conductive body film 62.

The memory element 20b is configured by the semiconductor layers 73N and 74N, the dielectric body film 93, and the conductive body film 63.

Due to this, the memory cell 4 in the first embodiment has a configuration where the cell selection transistor 10 and the memory elements 20a and 20b are connected in series between the terminals ts and tm as illustrated in FIG. 8C. That is, a series type described in FIG. 3A is formed.

A writing operation with respect to the memory cell 4 will be described.

Since the writing operation described above is carried out by forming the filament 46 with the potential difference which is applied between two semiconductors layers which are separated, to which of the semiconductor layers the voltage which is applied to the terminal ts and the potential which is applied to the terminal tm are each transmitted is determined according to a switch operation of each of the transistors (10, 20a, and 20b).

Figure 9A:
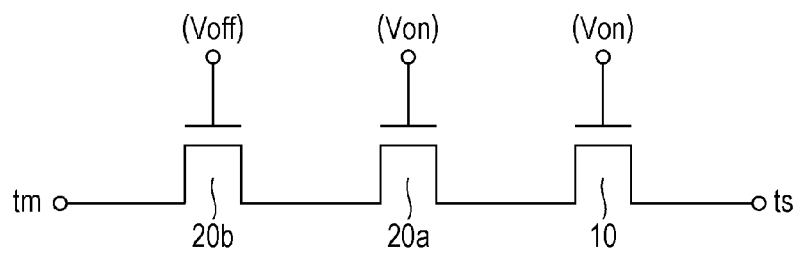
FIGS. 9A to 9E are explanatory diagrams of a writing operation of a memory cell of the first embodiment.
Figure 9B:
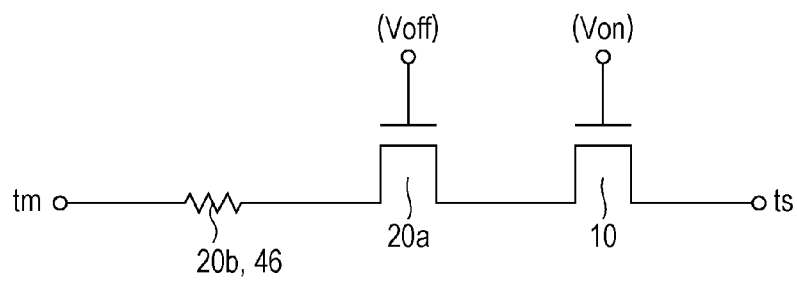

Firstly, a case of performing the writing to the memory element 20b is illustrated in FIGS. 9A and 9B. As illustrated in FIG. 9A, the cell selection transistor 10 is set to on (conductive) by applying a predetermined voltage Von to the gate of the cell selection transistor 10 using predetermined word lines WL which are not illustrated in the diagram.

Furthermore, a transistor as the memory element 20a is turned on by also applying the predetermined voltage Von to the gate of the memory element 20a using predetermined word lines.

By doing so, the voltage which is applied between the terminals ts and tm is to be applied between the source and the drain of the memory element 20b.

At this time, a potential is applied between the terminals ts and tm in consideration of a decrease in a voltage with the amount of the on resistance of the cell selection transistor 10 and the memory element 20a. Then, according to the potential difference which is applied to the source and the drain (the semiconductor layers 73N and 74N) of the memory element 20b, the filament 46 is formed between the semiconductor layers 73N and 74N and the writing is performed with respect to the memory element 20b as in FIG. 9B. Here, the memory element 20 which is written and where the filament 46 is formed is indicated as a resistor in the diagram.

Here, the potential difference which is necessary for forming a filament is from several V to several tens of V and the applying time is between several hundred ns and several μs.

Since the threshold is determined by the potential difference and is not an absolute value, it is preferable that the polarity of the voltages which are applied to the terminal ts and the terminal tm be opposite and be similar values to absolute values since a voltage which is applied to one terminal is small and a high withstand pressure transistor is not necessary in a peripheral circuit.

In a case of performing the writing to the memory element 20a in the subsequent second writing, the potential of the terminal ts is transmitted to the memory element 20a (the semiconductor layer 72N) by turning on the cell selection transistor 10 as illustrated in FIG. 9B. Then, the filament 46 is formed between the semiconductor layer 72N and the semiconductor layer 73N of the memory element 20a due to the potential difference with the potential of the terminal tm which is transmitted to the semiconductor layer 73N via the memory element 20b (the filament 46) after the writing (refer to FIG. 9C).

Figure 9C:
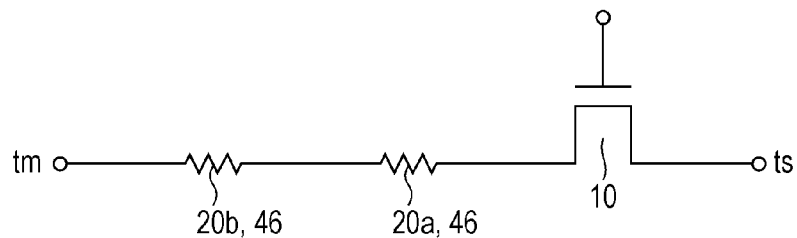
Figure 9D:
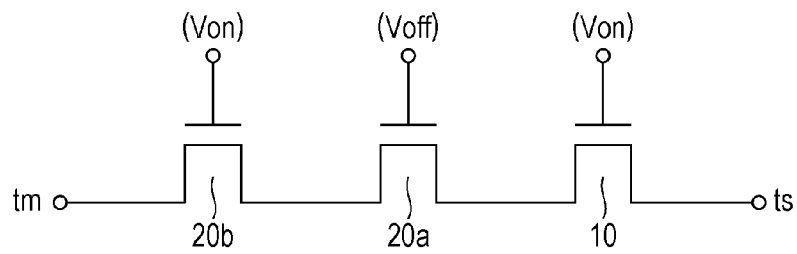
Figure 9E:
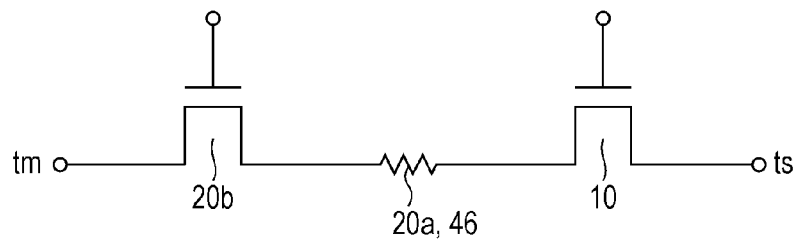

In addition, FIGS. 9D and 9E illustrate a case of initially performing the writing to the memory element 20a in the non-written memory cell 4.

As illustrated in FIG. 9C, a potential of the terminal ts is transmitted to the memory element 20a (the semiconductor layer 72N) by turning on the cell selection transistor 10. In addition, a potential of the terminal tm is transmitted to the semiconductor layer 73N by turning on the memory element 20b. Due to this, it is possible to apply the predetermined potential difference or more between the semiconductor layers 72N and 73N and the filament 46 is formed between the semiconductor layer 72N and the semiconductor layer 73N of the memory element 20a (refer to FIG. 9E).

In a case of forming a series type storage section 200 in the memory cell 4 described above, it is possible to perform the writing to an arbitrary memory element 20 out of a plurality of memory elements 20 which are connected in series by controlling not only the selection transistor 10 to be on/off, but also the non-written memory element 20.

In other words, as described in FIGS. 9A to 9E, when the writing is performed by setting one memory element out of the plurality of memory elements 20a and 20b which are connected with each other in series in the storage section 200 as a writing target, the non-written memory elements other than the one memory element may be controlled to be in a conductive state.

For example, as the present embodiment, in a case where the two memory elements 20a and 20b are both able to be controlled to be on/off, it is possible to respectively select writing to the memory element 20a and writing to the memory element 20b. As a result, it is possible to form the four states in FIG. 10.

State 1 is a default state where writing is not performed and for example, is equivalent to "00".

State 2 is a state where writing is performed to the memory element 20b and for example, is equivalent to "01".

State 3 is a state where writing is performed to the memory elements 20a and 20b and for example, is equivalent to "11".

State 4 is a state where writing is performed to the memory element 20a and for example, is equivalent to "10".

In this manner, it is possible to store information with 2 bits (four values) in one memory cell 4.

Here, as illustrated in FIG. 3B, a configuration where a portion of the memory elements 20 (for example, 20a) is able to be controlled to be on/off and where others of the memory elements 20 (for example, 20b) are set as non-control targets is also considered. In the case of FIG. 3B, the configuration is able to adopt the state 1, the state 2, and the state 3 of FIG. 10 and is able to store three values.

Next, a reading operation will be described. Regarding the reading, since the series resistance values between the terminals ts and tm change according to which of the memory elements 20 is written, it is possible to determine a writing state according to the current value (Icell: refer to FIG. 11) which flows in the terminal ts.

Figure 10:
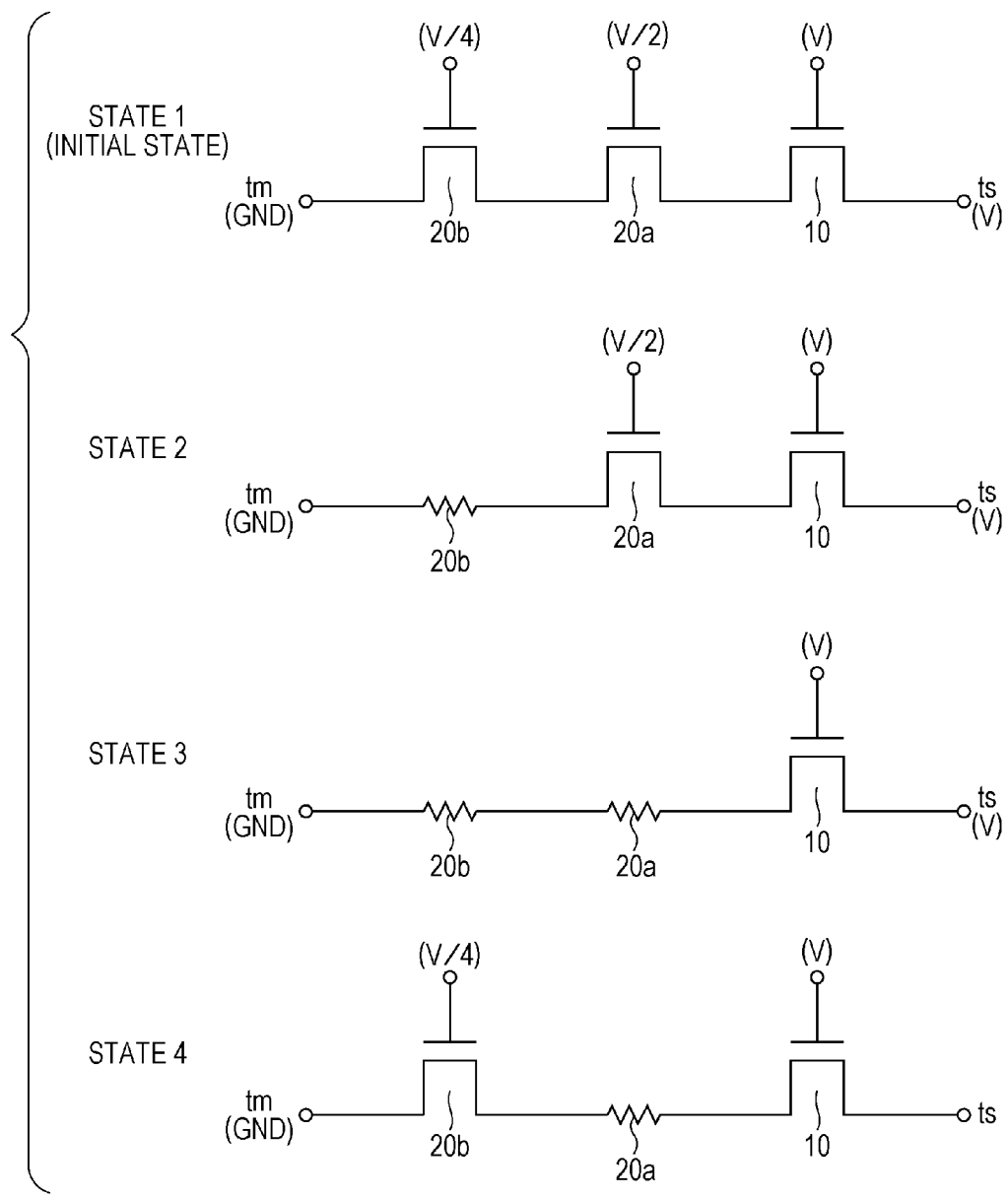
FIG. 10 is an explanatory diagram of a writing state and a reading operation of a memory cell of the first embodiment.

Here, it is necessary for the on resistance of each of the transistors (10, 20a, and 20b) to be different in order that the series resistance value is different in each of the four states in FIG. 10.

In particular, it is desirable that it be possible to stably carry out sensing by providing a series resistance difference which is as large as possible between each of the states.

Figure 11:
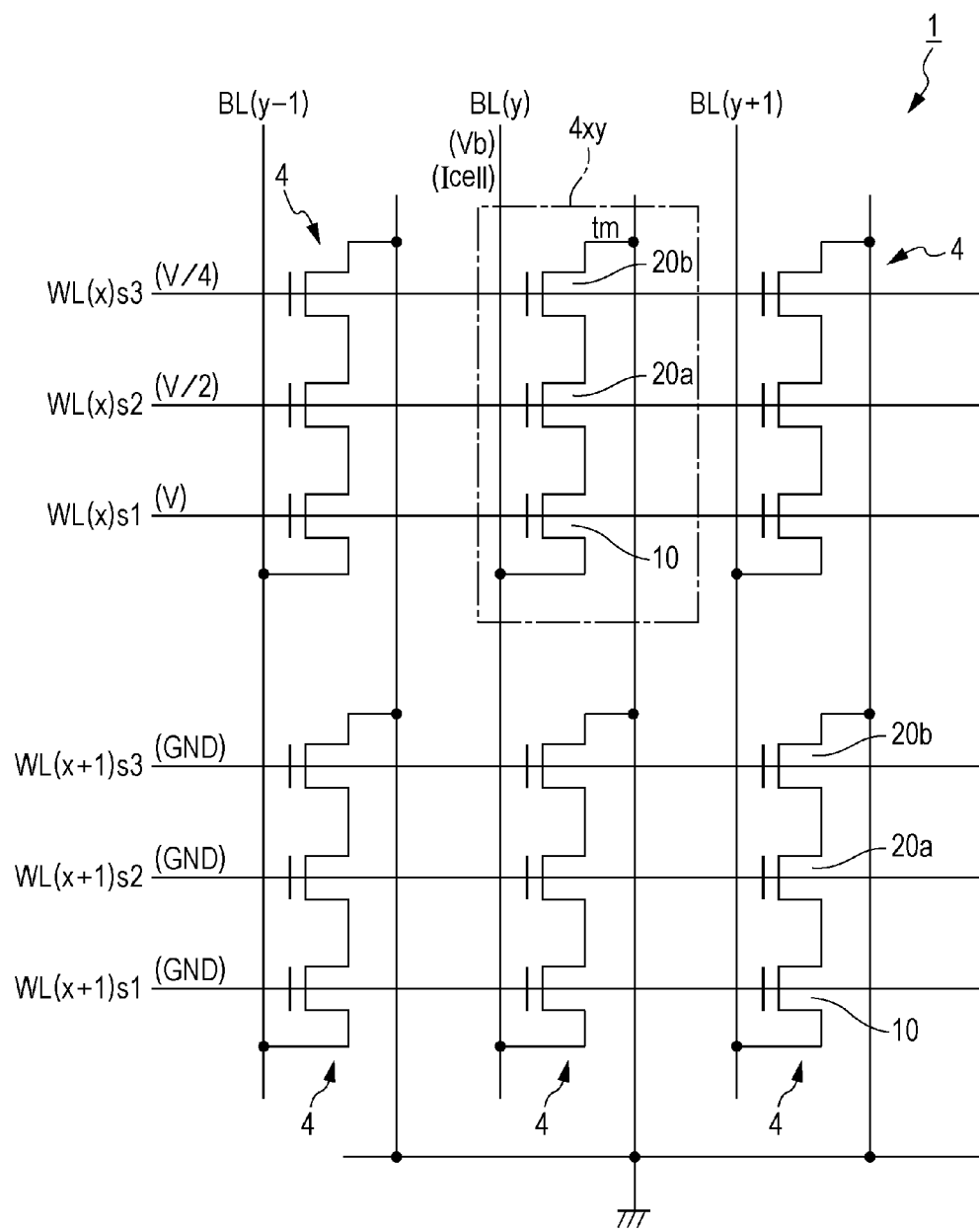
FIG. 11 is an explanatory diagram of control with respect to the memory cell of the first embodiment.

Therefore, the on resistance of each of the transistors (10, 20a, and 20b) is set by controlling the word line potential as illustrated in FIG. 11.

FIG. 11 illustrates a portion (six of the memory cells 4) of the memory cell array 1; however, now, setting a memory cell 4xy which is surrounded by a chain line as a writing target will be considered.

Here, three word lines WL (for example, WL(x)s1, WL(x)s2, and WL(x)s3) are connected with one memory cell 4(4xy) with respect to each of the gates of three transistors (10, 20a, and 20b).

In a case of reading the memory cell 4xy, the word line driving section 3, for example, applies a voltage V to the word line WL(x)s1, a voltage V/2 to the word line WL(x)s2, and a voltage V/4 to the word line WL(x)s3.

Other word lines (for example, WL(x+1)s1, WL(x+1)s2, WL(x+1)s3, and the like) are, for example, ground potentials.

In addition, the bit line driving sense amplifier section 2 applies a predetermined bit line potential Vb to a bit BL(y).

In a case of reading out the memory cell 4xy in this manner, a current (Icell) which is determined by the series resistance between the terminals ts and tm of the memory cell 4xy by applying a voltage to the terminal ts by the bit BL(y) flows to the terminal ts and it is possible to determine the reading state using this current amount.

In detail, the series resistance between the terminals ts and tm in the four states in FIG. 10 is as follows.

State 1 (on resistance of cell selection transistor 10)+(on resistance of memory element 20a)+(on resistance of memory element 20b)

State 2 (on resistance of cell selection transistor 10)+(on resistance of memory element 20a)+(filament resistance)

State 3 (on resistance of cell selection transistor 10)+(filament resistance)+(filament resistance)

State 4 (on resistance of cell selection transistor 10)+(filament resistance)+(on resistance of memory element 20b)

Since the composite resistance values in the state 1 to state 4 above are different due to the potentials (the gate voltages) of the three word lines WL(x)s1, WL(x)s2, and WL(x)s3 being set, for example, as above and the on resistances of the three transistors (10, 20a, and 20b) being different, it is possible to read out four values from one of the memory cells 4.

In particular, since the resistance value of the memory element 20 after writing is in the order of several k$\Omega$ and it is possible to largely change the on resistances of the memory element 20 in a non-written state and the cell selection transistor 10 according to the gate voltage, the degree of freedom in the set voltage is high.

It is possible to have a remarkable difference in the series resistance between the terminals ts and tm in the four states described above by setting the on resistances of the three transistors (10, 20a, and 20b) to be sufficiently different. That is, it is possible to widen the margin of the sensing during reading and to read out the four values in a stable manner by controlling the gate voltage during the reading.

Here, the voltage conditions of the terminal ts and the terminal tm may be reversed. It is possible to carry out the reading out by sensing the current of the terminal tm even when the terminal ts side is set as a ground and the terminal tm side is set as a voltage Vb.

As described above, in the first embodiment, the plurality of memory elements 20 in the storage section 200 are connected with each other in series and all or some of the plurality of memory elements 20 are configured such that it is possible to control conductivity or non-conductivity in a non-written state. Due to this, individual writing is possible with respect to all or a portion of the plurality of memory elements 20 and it is possible to appropriately realize storage of multiple values using the plurality of memory elements 20.

In detail, when writing is performed by setting one memory element 20 as a writing target, non-written memory elements 20 other than the memory element 20 are controlled to be a conductive state. Since each of the memory elements 20 is in series, by setting the non-written memory elements 20 other than the writing target to be a conductive state, it is possible to apply the potential difference for writing to the memory element 20 which is a writing target, that is, to apply the potential difference which is a threshold or more at which the filament 46 is formed and it is possible to realize individual writing for each of the memory elements 20.

In addition, the plurality of memory elements 20 which are connected in series are respectively formed with a transistor structure and each of the memory elements 20 is controlled using the voltage which is applied to the gate such that the on resistances in a non-written state are resistance values which are different from each other. In a case of a series type, information is read out according to the series resistance values of the plurality of memory elements 20 which are connected in series and the cell selection transistor 10. Therefore, it is possible to read out information values according to the written or non-written state of each of the memory elements 20 by setting the on resistances in a state where each of the memory elements 20 is non-written to resistance values which are different from each other.

In addition, in a series type, multiple value reading (for example, two bit reading which determines the four states described above) is possible with one time reading and there is also an advantage in that the reading efficiency is high.

In addition, the cell selection transistor 10 and each of the memory elements 20 are formed on the same active region 60. Due to this, it is possible to realize a memory device with a structure which is easily formed.

Here, although not illustrated in the diagram, it is desirable that the gate length of the cell selection transistor 10 be larger than the gate length of the transistor as each of the memory elements 20. This is for preventing miswriting to the cell selection transistor 10 from occurring.

4. Second Embodiment

Figure 12A:
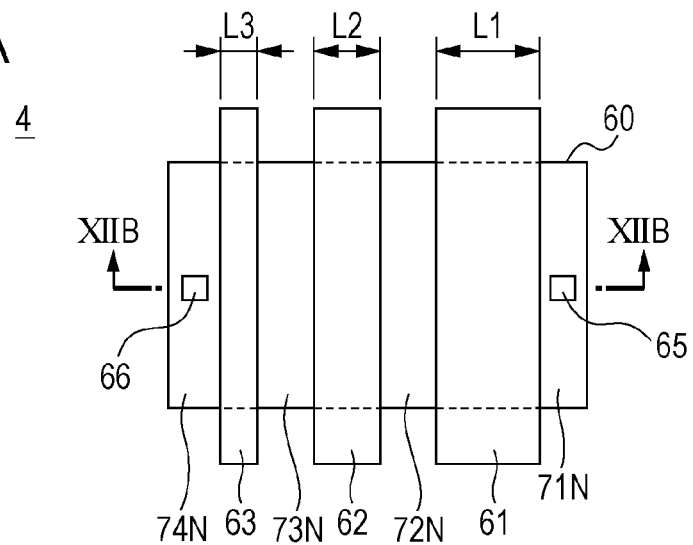
FIGS. 12A and 12B are explanatory diagrams of a memory cell of a second embodiment.
Figure 12B:
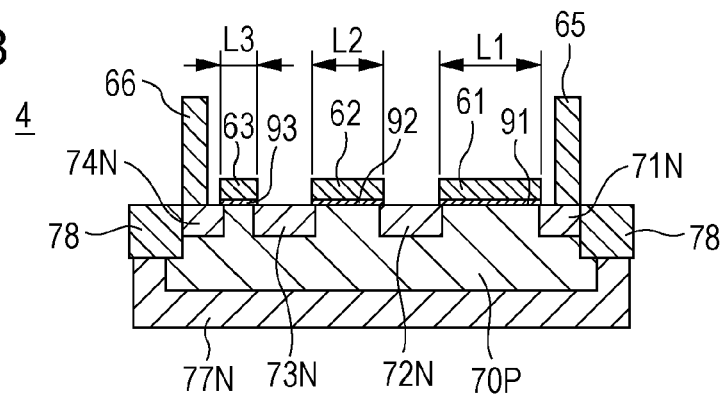

A planar diagram of the second embodiment is illustrated in FIG. 12A and a cross-sectional diagram of XIIB-XIIB' in FIG. 12A is illustrated in FIG. 12B. Here, in the diagrams of FIGS. 12A and 12B and beyond, the same reference numerals are used for the same sites as the diagrams described above and overlapping description will be omitted.

In this second embodiment, the gate lengths of the three transistors (10, 20a, and 20b) inside the memory cell 4 are different in the same series type configuration as the first embodiment.

In the diagram, the widths of the conductive body films 61, 62, and 63 are set as L1, L2, and L3 and illustrate the gate lengths of each of the transistors 10, 20a, and 20b. In such a case, L3<L2<L1.

By the gate lengths being different for each of the transistors, it is possible to make each of the on resistances of the cell selection transistor 10 and the memory elements 20a and 20b in a non-written state different.

In the first embodiment, the on resistance is set by the gate voltage; however, the second embodiment sets the on resistance according to the gate length. Due to this, it is possible to obtain different on resistances in the three transistors (10, 20a, and 20b) without controlling each of the gate voltages to be different and multiple value reading which appropriately determines the four states in FIG. 10 is possible.

Here, providing a difference in the on resistance by changing the process conditions, such as the density of a diffusion layer or a channel section, or an oxide film in addition to setting the on resistance by the gate length, may also be considered for each of the memory elements 20 and the cell selection transistor 10.

In addition, it is also possible to combine each of the first embodiment and the second embodiment. In other words, in addition to forming the gate lengths and the like to be different, it is possible to set the gate voltages to be different and to set the difference in the on resistance to be more remarkable.

In addition, in a case where the gate lengths are formed to be different as the present embodiment, the gate length of the selection transistor 10 may be favorably designed to be larger than the gate length of the memory element 20 in order to prevent miswriting of the cell selection transistor 10.

5. Third Embodiment

Figure 13A:
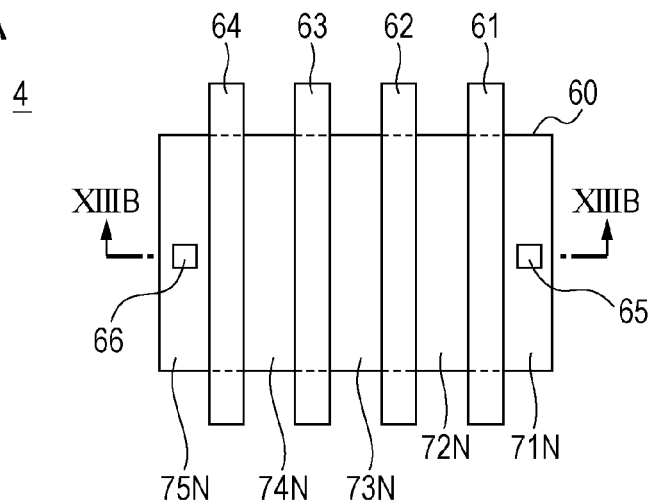
FIGS. 13A to 13C are explanatory diagrams of a memory cell of a third embodiment.
Figure 13B:
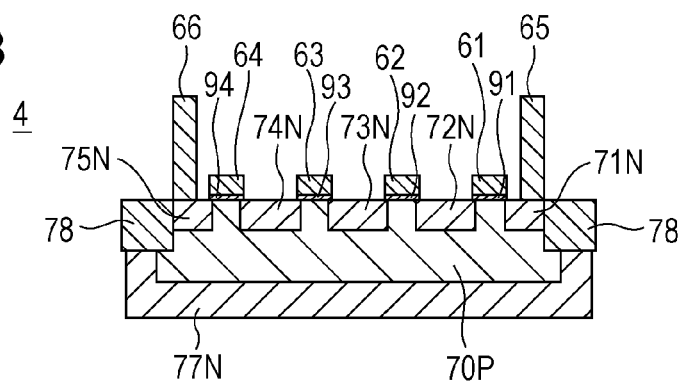
Figure 13C:
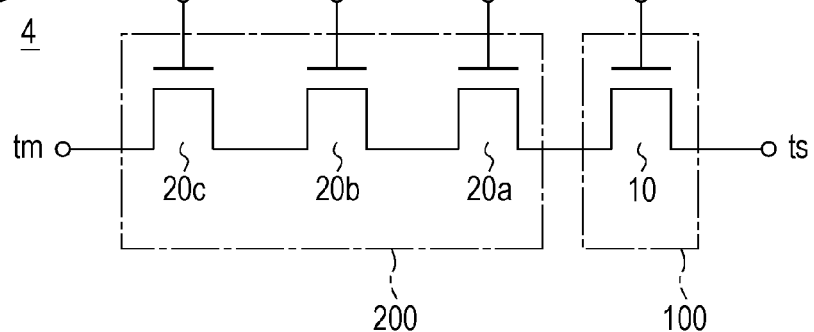

A planar diagram of the third embodiment is illustrated in FIG. 13A, a cross-sectional diagram of XIIIB-XIIIB' in FIG. 13A is illustrated in FIG. 13B, and an equivalent circuit diagram is illustrated in FIG. 13C.

A plurality of memory elements 20 are connected in series in the storage section 200 in the same manner as the first embodiment; however, three of the memory elements 20 (20a, 20b, and 20c) are provided.

The cell selection transistor 10 is configured by the semiconductor layers 71N and 72N, the dielectric body film 91, and the conductive body film 61.

The memory element 20a is configured by the semiconductor layers 72N and 73N, the dielectric body film 92, and the conductive body film 62.

The memory element 20b is configured by the semiconductor layers 73N and 74N, the dielectric body film 93, and the conductive body film 63.

The memory element 20c is configured by the semiconductor layers 74N and 75N, the dielectric body film 94, and the conductive body film 64.

The electrode 65 is formed on the semiconductor layer 71N and the electrode 66 is formed on the semiconductor layer 75N.

Due to this configuration, the memory cell 4 has a configuration where the cell selection transistor 10 and the memory elements 20a, 20b, and 20c are connected in series between the terminals ts and tm as illustrated in FIG. 13C.

In such a manner, by increasing the number of the memory elements 20 on the same active region 60, it is possible for one memory cell 4 to hold more information (in a case of N memory elements, $2^N$ items of information) and it is possible to further increase the surface area efficiency.

6. Fourth Embodiment

An example of a parallel type will be described as a fourth embodiment.

Figure 14A:
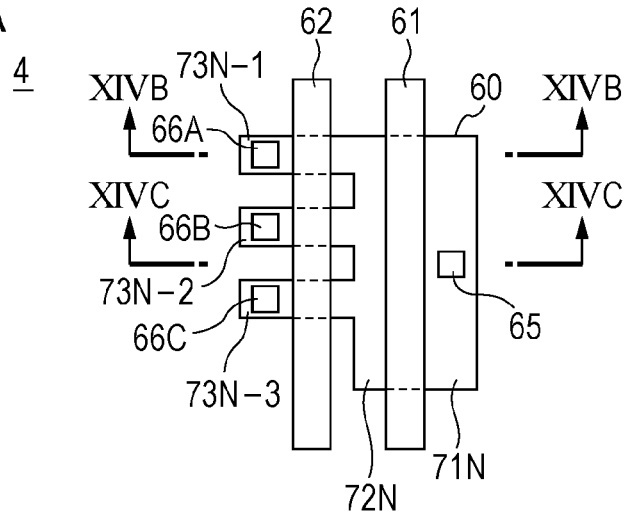
FIGS. 14A to 14C are explanatory diagrams of a memory cell of a fourth embodiment.
Figure 14B:
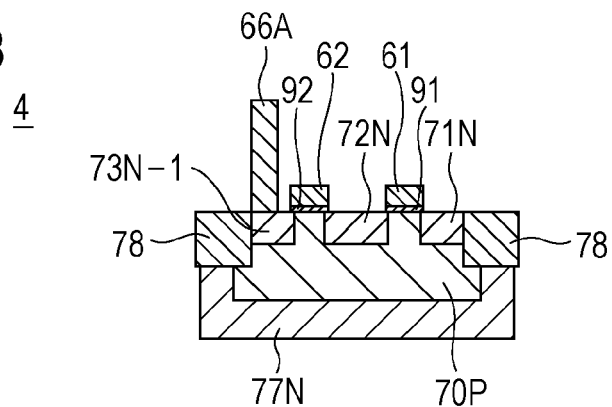
Figure 14C:
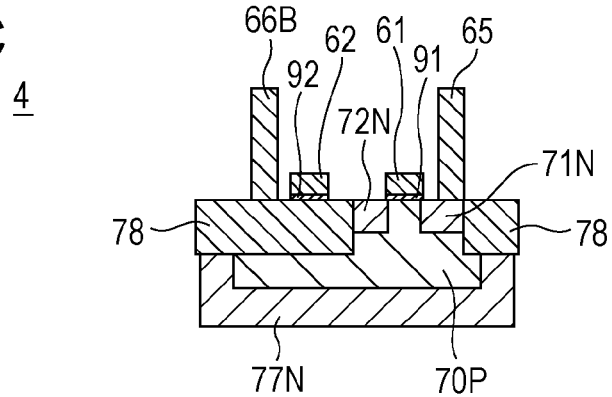

A planar diagram of the fourth embodiment is illustrated in FIG. 14A, a cross-sectional diagram of XIVB-XIVB' in FIG. 14A is illustrated in FIG. 14B, and a cross-sectional diagram of XIVC-XIVC' in FIG. 14A is illustrated in FIG. 14C.

FIG. 14A, FIGS. 14B, and 14C illustrate the active region 60, the conductive body films 61 and 62, the electrodes 65, 66A, 66B, and 66C, the P type semiconductor layer 70P, the N type semiconductor layers 71N, 72N, 73N-1, 73N-2, 73N-3, and 77N, the element separation region 78, and the dielectric body films 91 and 92.

In detail, the five N type semiconductor layers 71N, 72N, 73N-1, 73N-2, and 73N-3 are formed in the P type semiconductor layer 70P. The dielectric body films 91 and 92 and the conductive body films 61 and 62 are each formed in the regions which correspond to between the semiconductor layers 71N and 72N and between 72N and 73N (73N-1, 73N-2, and 73N-3) on the semiconductor layer 70P.

The electrode 65 which is electrically connected with the semiconductor layer 71N is formed in the semiconductor layer 71N. In addition, the electrodes 66A, 66B, and 66C which are each electrically connected are formed on the semiconductor layers 73N-1, 73N-2, and 73N-3.

The memory cell 4 has an enclosed N configuration which covers the semiconductor layer 70P with the semiconductor layer 77N and electrically separates the semiconductor layer 70P from a substrate.

Figure 15A:
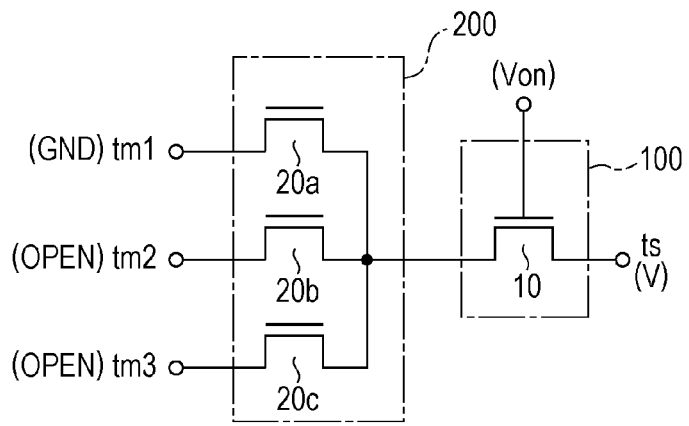
FIGS. 15A to 15D are explanatory diagrams of a writing state and a reading operation of a memory cell of the fourth embodiment.
Figure 15B:
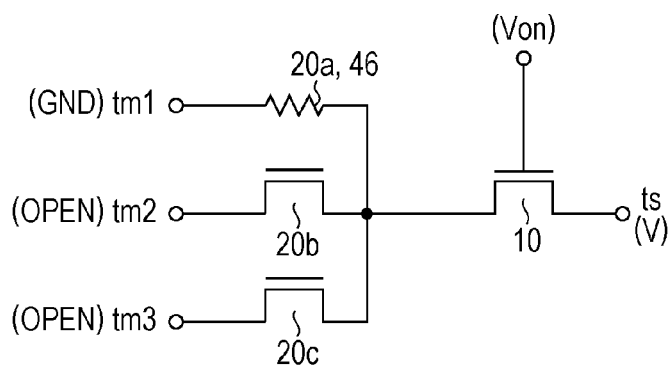

According to the configuration above, the memory cell 4 of the fourth embodiment has a configuration which is illustrated in the equivalent circuit diagram of FIG. 15A. That is, the configuration is a parallel type configuration which is described in FIG. 4.

The electrode 65 configures a terminal ts on the side which is connected with the bit lines BL. The electrodes 66A, 66B, and 66C configure, for example, terminals tm1, tm2, and tm3 which are respectively connected with the ground side (switches SW1, SW2, and SW3 in FIG. 4).

The cell selection transistor 10 is configured by the semiconductor layers 71N and 72N, the dielectric body film 91, and the conductive body film 61.

The memory element 20a is configured by the semiconductor layers 72N and 73N-1, dielectric body film 92, and the conductive body film 62.

The memory element 20b is configured by the semiconductor layers 72N and 73N-2, the dielectric body film 92, and the conductive body film 62.

The memory element 20c is configured by the semiconductor layers 72N and 73N-3, dielectric body film 92, and the conductive body film 62.

In this manner, the cell selection transistor 10 and the memory elements 20a, 20b, and 20c are formed on the same active region 60. Then, the memory cell 4 in the fourth embodiment has a configuration where the cell selection transistor 10 (the cell selection section 100) and the storage section 200 are connected in series as in FIG. 4 and where the plurality of memory elements 20 are connected with each other in parallel in the storage section 200.

Description will be given of a writing operation and a reading operation using FIGS. 15A to 15D.

For example, in a case of performing writing to the memory element 20a, the terminal tm1 is connected with the ground and the terminals tm2 and tm3 are set to be open as illustrated in FIG. 15A. For example, the switch SW1 in FIG. 4 is set to be on and the switches SW2 and SW3 are set to be off.

By doing so, the memory cell 4 has a configuration where the cell selection transistor 10 and the memory element 20a are connected in series between the terminals ts and tm1.

Then, the cell selection transistor 10 is set to be on (conductive) by applying a predetermined voltage Von to the gate of the cell selection transistor 10.

By doing so, the voltage which is applied to between the terminals ts and tm1 is applied to between the source and the drain of the memory element 20a. Then, according to the potential difference which is applied to the source and the drain (the semiconductor layers 72N and 73N-1) of the memory element 20a, the filament 46 is formed between the semiconductor layers 72N and 73N-1 and writing is performed with respect to the memory element 20a as in FIG. 15B.

Figure 15C:
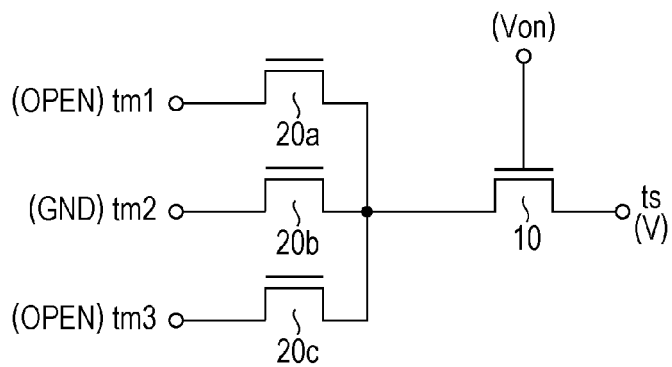

FIG. 15C illustrates a case of performing the writing to the memory element 20b.

In such a case, the terminal tm2 is connected with the ground and the terminals tm1 and tm3 are set to be open. Due to this, the memory cell 4 has a configuration where the cell selection transistor 10 and the memory element 20b are connected in series between the terminals ts and tm2.

Then, the cell selection transistor 10 is set to be on (conductive) by applying a predetermined voltage Von to the gate of the cell selection transistor 10.

Figure 15D:
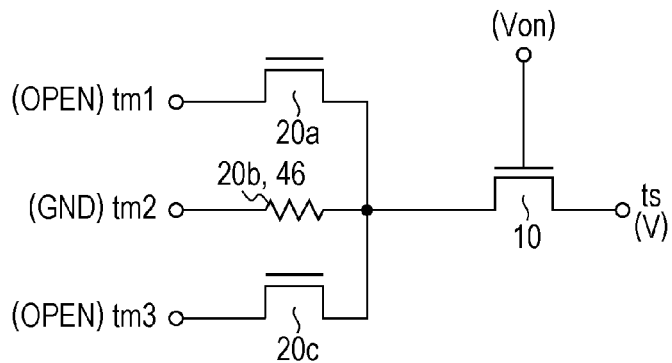

By doing so, the voltage which is applied to between the terminals ts and tm2 is applied to between the source and the drain of the memory element 20b and due to the potential difference, the filament 46 is formed between the semiconductor layers 72N and 73N-2 and writing is performed with respect to the memory element 20b as in FIG. 15D.

A case of performing the writing to the memory element 20c is not illustrated in the diagram; however, the same method may be used. That is, the terminal tm3 is connected with the ground, the terminals tm1 and tm2 are set to be open, and the cell selection transistor 10 is set to be on.

Here, the potential difference which is necessary for these writings is between several V and several tens of V and the application time is between several hundred ns to several μs. Since the threshold is determined according to the potential difference and not an absolute value, it is preferable that the polarity of the voltages which are applied to the terminal ts and the terminal tm1 be opposite and be similar values to absolute values since a voltage which is applied to one terminal is small and a high withstand pressure transistor is not necessary in a peripheral circuit.

Due to such writing, the memory elements 20a, 20b, and 20c are respectively able to individually enter the states of "0: non-written" and "1: written" and it is possible to store information which is equivalent to three bits.

At the time of the reading operation, the open/close of the terminals tm1, tm2, and tm3 may be controlled according to the target memory element 20 in the same manner as during writing.

For example, in a case of reading the memory element 20a, it is possible to selectively read out only the path of the memory element 20a by turning on the selection transistor 10, setting the terminal tm1 to GND, and setting the terminals tm2 and tm3 to an open state.

Since the series resistance values between the terminals ts and tm change according to the written or non-written state of the memory element 20, when a voltage is applied to the terminal ts, it is possible to determine the writing state according to the value of the current which flows in the terminal ts. Naturally, even when the voltage conditions of the terminal ts and the terminals tm (tm1, tm2, and tm3) are reversed, reading is possible by sensing the current on the terminal tm side.

As described above, in the fourth embodiment, the plurality of memory elements 20 in the storage section 200 are connected with each other in parallel and each is connected with the cell selection transistor 10 in series. In a case of such a parallel type, writing and reading are possible using the cell selection transistor 10 with respect to each of the memory elements 20 by connecting each of the memory elements 20 in series with the cell selection transistor 10. Due to this, it is possible to store information with a plurality of bits in one memory cell 4.

In addition, it is possible to form the memory element 20 with the smallest size of an MOS. However, since it is necessary to pass a current of several tens of mA to the memory element for writing, it is necessary for the cell selection transistor 10 to have a certain size (10 to 30 μm).

When the configuration is a parallel type configuration which uses the cell selection transistor 10 in the plurality of memory elements 20, since it is not only possible to store a plurality of bits of information in one memory cell 4, but also to arrange the memory elements 20 according to the length of the gate width of the cell selection transistor 10, the surface area efficiency is increased. Even when the separation width of the memory elements 20 is considered, it is possible to arrange several to several tens of memory elements 20 with respect to one cell selection transistor 10.

Here, it is preferable to prevent miswriting of the cell selection transistor 10 by making the gate length of the cell selection transistor 10 larger than the gate length of the memory elements 20.

In addition, in a case of a parallel type as in the fourth embodiment, when writing is performed by setting one memory element 20 out of the plurality of memory elements 20 which are connected with each other in parallel in the storage section 200 as a writing target, for the memory elements 20 other than the one memory element 20, the terminal tm on an opposite side to a series connection end with the cell selection section 100 is controlled to be in an open state.

With respect to the memory elements 20 where the terminal tm side is controlled to be in an open state, since the potential difference which is applied to the storage section 200 is not applied, writing is not performed. In other words, it is possible to apply a potential difference to only the memory element 20 which is a writing target and which is not in an open state, that is, to apply a potential difference which is equal to or greater than a threshold at which the filament 46 is formed.

In addition, when reading is performed by setting one memory element 20 as a reading target, for the memory elements 20 other than the one memory element 20, the terminal tm on an opposite side to a series connection end with the cell selection section 100 is controlled to be in an open state. Due to this, it is possible to observe composite resistance values of the target memory element 20 and the cell selection transistor 10, that is, it is possible to read information of the individual memory element 20.

Here, regarding the reading, the parallel composite resistance value of the entire storage section 200, that is, of a plurality of memory elements 20 may be observed.

For example, by making the on resistances of the memory elements 20a, 20b, and 20c different from each other, each of the parallel composite resistance values is made to be different in combinations (eight states equivalent to three bits) of the writing states of each of the memory elements 20a, 20b, and 20c. For example, the terminals tm1, tm2, and tm3 may be connected with the ground by setting these terminals in common as terminals tm.

By doing so, since it is possible to make the resistance values (the series composite resistance values of the cell selection section 100 and the storage section 200) between the terminals ts and tm in each of the eight states different, it is possible to read out three bit information with a one time reading operation, for example, by detecting a current value on the terminal ts side.

In addition, in the configuration in FIGS. 14A to 14C and FIGS. 15A to 15D, the terminals tm1, tm2, and tm3 may be connected with the ground via the switches SW1, SW2, and SW3 illustrated in FIG. 4 or may have a configuration where it is possible to control the connection so as to be individually connected with other potential levels.

For example, at the time of writing to a certain memory element 20, the potential difference at which the filament 46 is formed may not be applied with respect to the other memory elements 20 which are not a writing target. Therefore, with respect to the other memory elements 20 which are not a writing target, a predetermined potential may be applied to the terminal tm side such that the potential difference is not generated.

7. Fifth Embodiment

Figure 16A:
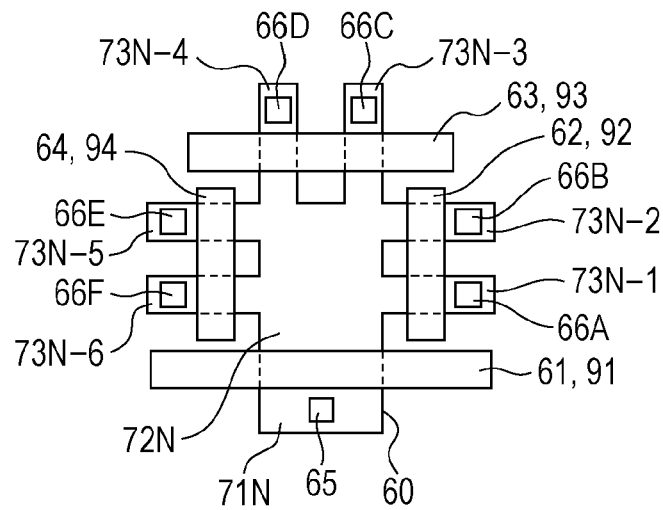
FIGS. 16A and 16B are explanatory diagrams of a memory cell of a fifth embodiment.
Figure 16B:
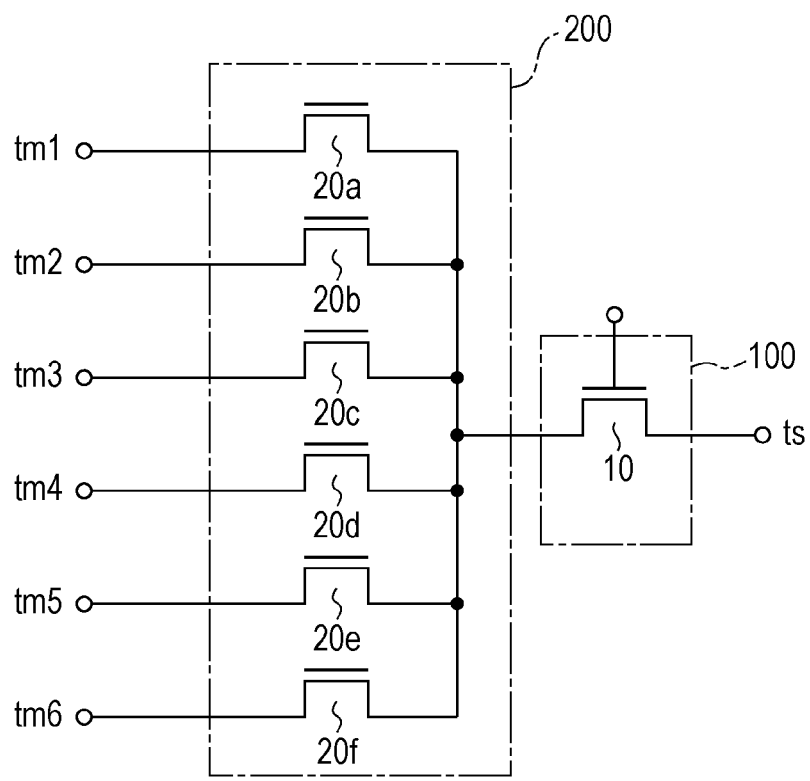

A planar diagram of the fifth embodiment is illustrated in FIG. 16A and an equivalent circuit diagram is illustrated in FIG. 16B. It is possible to say that the fifth embodiment is a modification example of the parallel type as in the fourth embodiment.

As illustrated in FIG. 16A, in the active region 60, the N type semiconductor layers 71N, 72N, and 73N-1 to 73N-6 are formed in the P type semiconductor layer 70P which is not illustrated in the diagram. In addition, the conductive body films 61, 62, 63, and 64 (and the dielectric body films 91, 92, 93, and 94 on the lower sections thereof which are not illustrated in the diagram) which configure the gate are provided.

The electrode 65 which configures the terminal ts is formed on the semiconductor layer 71N. In addition, the electrodes 66A, 66B, 66C, 66D, 66E, and 66F which are each electrically connected are formed on the semiconductor layers 73N-1, 73N-2, 73N-3, 73N-4, 73N-5, and 73N-6. These configure the terminals tm1, tm2, tm3, tm4, tm5, and tm6 illustrated in FIG. 16B.

The cell selection transistor 10 is configured by the semiconductor layers 71N and 72N, the dielectric body film 91 and the conductive body film 61.

The memory element 20a is configured by the semiconductor layers 72N and 73N-1, the dielectric body film 92, and the conductive body film 62.

The memory element 20b is configured by the semiconductor layers 72N and 73N-2, the dielectric body film 92, and the conductive body film 62.

The memory element 20c is configured by the semiconductor layers 72N and 73N-3, the dielectric body film 93 and the conductive body film 63.

The memory element 20d is configured by the semiconductor layers 72N and 73N-4, the dielectric body film 93 and the conductive body film 63.

The memory element 20e is configured by the semiconductor layers 72N and 73N-5, the dielectric body film 94 and the conductive body film 64.

The memory element 20f is configured by the semiconductor layers 72N and 73N-6, the dielectric body film 94 and the conductive body film 64.

In such a manner, the cell selection transistor 10 and the memory elements 20a to 20f are formed on the same active region 60. Then, the memory cell 4 in the fifth embodiment has a configuration where the cell selection transistor 10 (the cell selection section 100) and the storage section 200 are connected in series as in FIG. 16B and where the plurality of memory elements 20 are connected with each other in parallel in the storage section 200.

In such a case, a writing operation and a reading operation may be performed using the same method as the fourth embodiment.

Then, further increases in the number of bits are possible by increasing the number of the memory elements 20 on the same active region 60 in this manner.

In particular, it is not typically necessary that polysilicon regions (the conductive body films 62, 63, and 64) which configure the gates of the memory element 20 and the cell selection transistor 10 be parallel and additionally, it is not necessary that all of the gates of the plurality of memory elements 20 be in common. Therefore, the degree of freedom in the layout is high and it is possible to increase the surface area efficiency by devising the layout of the active region 60 and the gate as in FIG. 16A.

8. Sixth Embodiment

As a sixth embodiment, a composite type where a series type and a parallel type are composite will be described. In other words, the sixth embodiment is an example where the fourth and the fifth embodiments are combined with the first to the third embodiments.

Figure 17A:
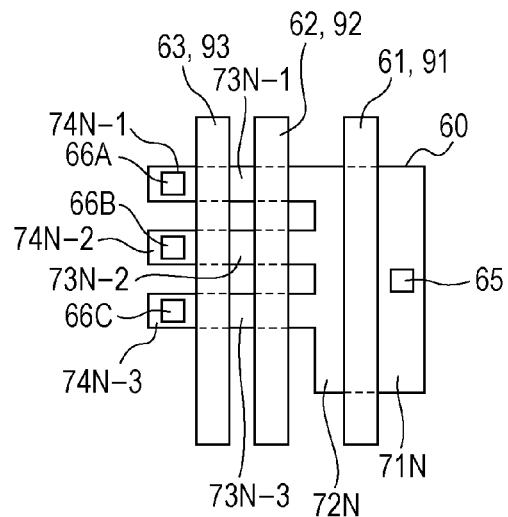
FIGS. 17A and 17B are explanatory diagrams of a memory cell of a sixth embodiment.
Figure 17B:
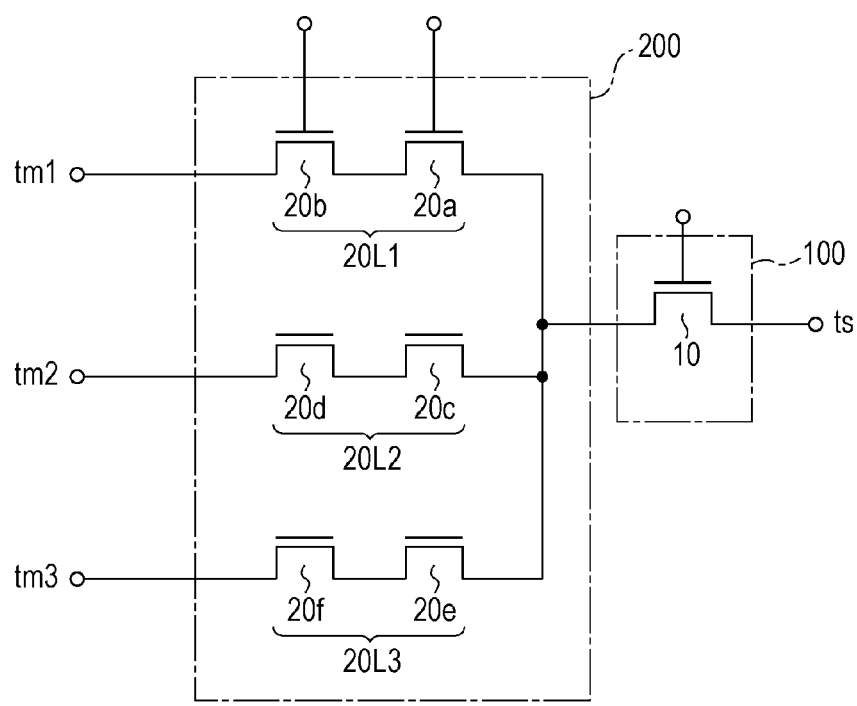

A planar diagram of the sixth embodiment is illustrated in FIG. 17A and an equivalent circuit diagram is illustrated in FIG. 17B.

As illustrated in FIG. 17A, in the active region 60, the N type semiconductor layers 71N, 72N, and 73N-1 to 73N-3 are formed in a P type semiconductor layer 70P which is not illustrated in the diagram. In addition, the conductive body films 61, 62, and 63 (and the dielectric body films 91, 92, and 93 on the lower sections thereof which are not illustrated in the diagram) which configure the gate are provided.

The electrode 65 which configures the terminal ts is formed on the semiconductor layer 71N. In addition, the electrodes 66A, 66B, and 66C which are each electrically connected are formed on the semiconductor layers 73N-1, 73N-2, and 73N-3. These configure the terminals tm1, tm2, and tm3 illustrated in FIG. 17B.

The cell selection transistor 10 is configured by the semiconductor layers 71N and 72N, the dielectric body film 91, and the conductive body film 61.

The memory element 20a is configured by the semiconductor layers 72N and 73N-1, the dielectric body film 92, and the conductive body film 62.

The memory element 20b is configured by the semiconductor layers 73N-1 and 74N-1, the dielectric body film 93, and the conductive body film 63.

The memory element 20c is configured by the semiconductor layers 72N and 73N-2, the dielectric body film 92, and the conductive body film 62.

The memory element 20d is configured by the semiconductor layers 73N-2 and 74N-2, the dielectric body film 93, and the conductive body film 63.

The memory element 20e is configured by the semiconductor layers 72N and 73N-3, the dielectric body film 92, and the conductive body film 62.

The memory element 20f is configured by the semiconductor layers 73N-3 and 74N-3, the dielectric body film 93, and the conductive body film 63.

In such a manner, the cell selection transistor 10 and the memory elements 20a to 20f are formed on the same active region 60.

Then, in the memory cell 4 in the sixth embodiment, the cell selection transistor 10 (the cell selection section 100) and the storage section 200 are connected in series as in FIG. 17B.

A plurality of series element sections 20L1, 20L2, and 20L3 are provided in the storage section 200 according to the plurality of memory elements which are connected with each other in series.

The series element section 20L1 indicates the series connection of the memory elements 20a and 20b. The series element section 20L2 indicates the series connection of the memory elements 20c and 20d. The series element section 20L3 indicates the series connection of the memory elements 20e and 20f.

Then, each of the series element sections 20L1, 20L2, and 20L3 are connected with each other in parallel and each is connected with the cell selection transistor 10 in series. In addition, the plurality of memory elements 20 in each of the series element sections 20L1, 20L2, and 20L3 are able to be controlled in a non-written state to be conductive/non-conductive by being provided with a transistor structure which has a gate.

For the writing operation in such a case, combining the series type and the parallel type described above may be considered. Description will be given using an example where writing to the memory element 20b is performed using FIGS. 18A and 18B.

Figure 18A:
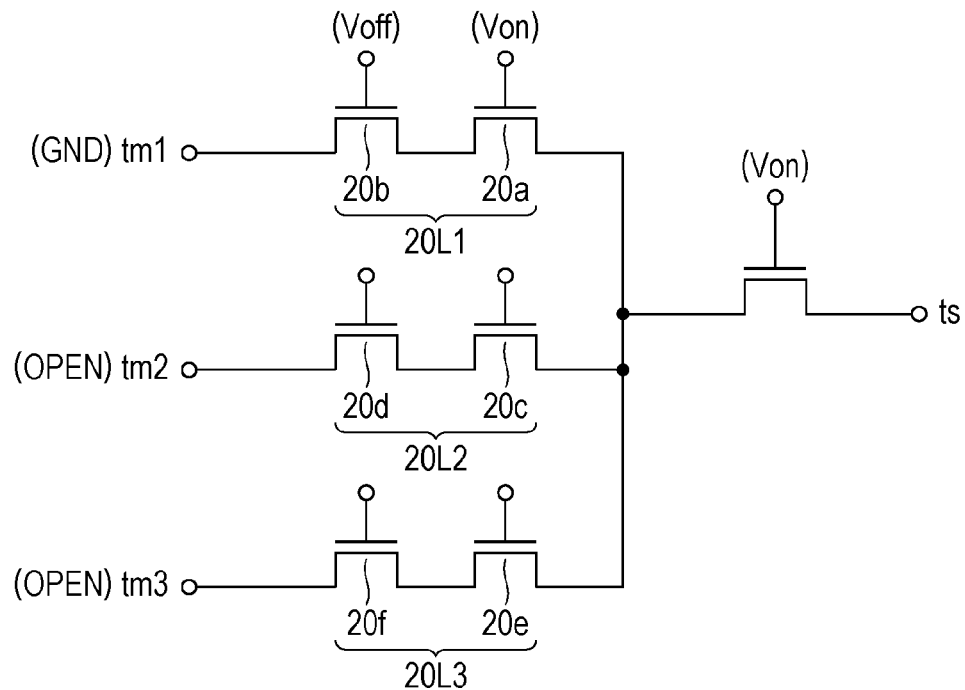
FIGS. 18A and 18B are explanatory diagrams of a writing operation and a reading operation of a memory cell of the sixth embodiment.

In a case of performing writing to the memory element 20b, the terminal tm1 is connected with the ground and the terminals tm2 and tm3 are set to be open as illustrated in FIG. 18A. By doing so, the memory cell 4 has a configuration where the cell selection transistor 10 and the series element section 20L1 (the memory elements 20a and 20b) are connected in series between the terminals ts and tm1.

Then, the cell selection transistor 10 is set to be on (conductive) by applying a predetermined voltage Von to the gate of the cell selection transistor 10. Furthermore, the transistor as the memory element 20a is set to be on by also applying a predetermined voltage Von to the gate of the memory element 20a. By doing so, the voltage which is applied between the terminals ts and tm1 is applied to between the source and the drain of the memory element 20b.

Figure 18B:
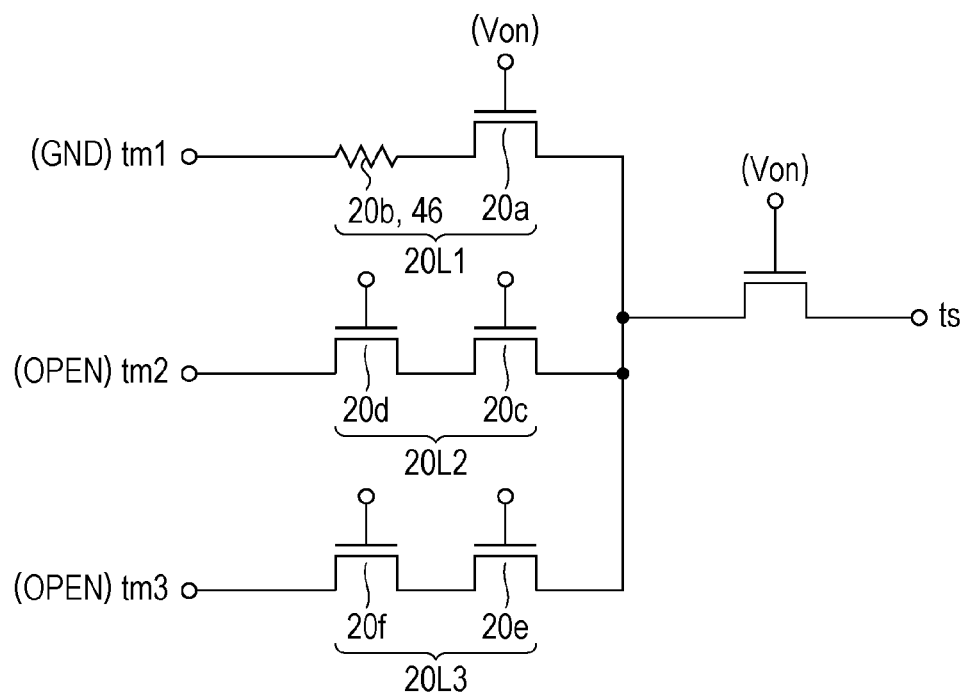

Due to the potential difference which is applied to the source and the drain (the semiconductor layers 73N-1 and 74N-1) of the memory element 20b, the filament 46 is formed between the semiconductor layers 73N-1 and 74N-1 and writing is performed with respect to the memory element 20b as in FIG. 18B.

In a case of performing writing to the memory element 20a from the state in FIG. 18B, in a state where the terminal tm1 is connected with the ground and where the terminals tm2 and tm3 are set to be open, a voltage, which is applied to between the terminals ts and tm1 by setting the cell selection transistor 10 to be on, may be applied to the memory element 20a.

In addition, in a case of performing writing to the memory element 20a from the initial state in FIG. 18A, in a state where the terminal tm1 is connected with the ground and where the terminals tm2 and tm3 are set to be open, a voltage which is applied to between the terminals ts and tm1 may be applied to the memory element 20a by setting the cell selection transistor 10 and the memory element 20b to be on.

Writing to the memory elements 20 in the other series element sections 20L2 and 20L3 in the same manner may be considered.

For the reading operation, combining the series type and the parallel type described above may also be considered.

That is, any one of the terminals tm1, tm2, and tm3 is connected with the ground to correspond to the series element section (any one of 20L1, 20L2, and 20L3) which is a reading target and the others are set to be open. For example, in a case of reading out the series element section 20L1, the terminal tm1 is connected with the ground and the terminals tm2 and tm3 are set to be open.

In the state, a voltage for reading is applied to the terminal ts in the same manner as the case of the series type. At this time, it is possible to read out four values from one series element section 20L1 by making the on resistances of the three transistors (10, 20a, and 20b) different.

A method for making the on resistance of each of the transistors different may be by setting of the gate voltage in the same manner as the first embodiment or may use the physical structure of the transistor such as the gate length, the density of a diffusion layer or a channel section, or an oxide film as described in the second embodiment.

As described above, in the sixth embodiment, the plurality of series element sections 20L (20L1, 20L2, and 20L3) are provided in the storage section 200 according to the plurality of memory elements 20 which are connected with each other in series, each of the series element sections 20L is connected with each other in parallel, and each is connected with the cell selection transistor 10 in series. All or some of the plurality of memory elements 20 in each of the series element sections 20L are configured such that it is possible to control conductivity or non-conductivity in a non-written state.

By being set as a serial-to-parallel composite type, it is possible to obtain advantages from both such as further improvement of the surface area efficiency or an increase in the degree of freedom in the layout as in the parallel type and improvement of reading efficiency due to multiple value reading with one time reading according to the series type.

In addition, at the time of writing, for the series element sections 20L other than the target series element section 20L, the cell selection transistor 10 side controls the terminal tm on an opposite side to be in an open state and further controls the non-written memory elements other than the memory element 20 which is the writing target in the target series element section 20L to be in a conductive state.

Due to this, it is possible to apply a potential difference for writing to only the series element section 20L which includes the memory element 20 which is the writing target. In addition, in the series element section 20L, it is possible to apply a potential difference for writing to only the memory element 20 which is the writing target, for example, to apply a potential difference which is equal to or greater than a threshold at which a filament is formed. Due to this, writing to an arbitrary memory element 20 is realized.

In addition, when reading is performed by setting one series element section 20L as a reading target, for the series element sections 20L other than the one series element section 20L, the terminal tm on an opposite side to the series connection end with the cell selection transistor 10 is controlled to be in an open state. Due to this, it is possible to observe the composite resistance value of an arbitrary series element section 20L and the cell selection transistor 10 and multiple value reading from the series element section 20L is possible.

Here, the memory element 20 which is able to be controlled to be on/off by being provided with the gate structure may be a portion in the series element section 20L. For example, the series element sections 20L1, 20L2, and 20L3 may include the memory element 20 which is not able to be controlled to be on/off as illustrated in FIG. 3B in a part.

9. Summary and Modification Examples

Description has been given of embodiments above; however, the memory device in each of the embodiments is provided with the memory cell 4 which has one cell selection section 100 and the storage section 200 which is connected in series with respect to the cell selection section 100 and which is selected as an access target for writing or reading by the cell selection section 100. Then, the storage section 200 is provided with a plurality of memory elements 20 which are able to be written one time only and where information is held by changing resistance values in a non-written state and a written state.

By providing the plurality of memory elements 20 in one storage section 200 in this manner, it is possible to store a plurality of bits of information in one memory cell 4 and it is possible to suppress an increase in the macro surface area with respect to the increase in the number of bits.

That is, it is possible to realize a memory element with a small element surface area which is about the same as a normal MOS transistor, it is possible to miniaturize the memory cells due to one memory cell 4 being able to hold information with a plurality of bits, and there is a particular advantage in a case where the number of bits is large. Accordingly, it is possible to realize a memory device with good surface area efficiency.

In addition, since it is possible to realize the memory element 20 within the process range of a normal CMOS process, there is also a great advantage in the point of the wafer cost.

The writing method of the embodiments controls the cell selection section 100 (the cell selection transistor 10) of the memory cell 4 which is the writing target to be in an on state according to the word line WL which corresponds to the memory cell 4 which is the writing target out of the plurality of word lines WL which are arranged with respect to the memory cell array 1 where the memory cells 4 are arranged in a shape of a matrix. Furthermore, the writing to the memory element is performed by applying a voltage using the bit line BL which corresponds to the memory cell 4 which is the writing target out of the plurality of bit lines BL which are arranged with respect to the memory cell array 1 and applying a predetermined potential difference or more to both ends of one memory element 20 in the storage section 200 of the memory cell 4 which is the writing target.

By applying a predetermined potential difference or more to only the memory element 20 which is the writing target with respect to a plurality of memory elements 20 of the storage section 200 as a series type, a parallel type, or a composite type, it is possible to appropriately write to individual memory elements 20 with respect to the memory cell 4 which is able to store multiple values as a plurality of bits.

The reading method of the embodiments controls the cell selection section 100 (the cell selection transistor 10) of the memory cell 4 which is the reading target to be in an on state according to the word line WL which corresponds to the memory cell 4 which is the reading target out of the plurality of word lines WL which are arranged with respect to the memory cell array 1 where the memory cell 4 is arranged in a shape of a matrix. In addition, the reading of information which is stored in the memory element 20 in the storage section 200 is performed by applying a voltage to the cell selection section 100 and the storage section 200 of the memory cell 4 which is the reading target using the bit line BL which corresponds to the memory cell 4 which is the reading target out of the plurality of bit lines BL which are arranged with respect to the memory cell array 1 and detecting the series composite resistance value.

By detecting the resistance value of the memory cell 4 which is the reading target with respect to the plurality of memory elements 20 of the storage section 200 as a series type, a parallel type, or a complex type, it is possible to appropriately read information which is stored in the storage section 200 which is able to store multiple values as a plurality of bits.

Here, various modification examples, which are not related to the examples of the embodiments, are envisioned in the present technology.

For example, description was given of an example where the cell selection transistor 10 and the plurality of memory elements 20 are formed on the same active region 60; however, it is not typically necessary for the forming to be on the same active region 60. For example, the semiconductor layers (N+ regions) where the cell selection transistor 10 and the plurality of memory elements 20 are formed may be connected to each other by wiring after separating elements by Shallow Trench Isolation (STI) or the like.

In addition, for a case of a series type and a case of the series element section 20L which is a composite type, description was given that multiple value reading is possible by making the on resistances of the transistors different; however, making the resistance value of the filament 46 different in each of the memory elements 20 instead of the on resistance of the transistor may be considered. For example, the resistance values of each of the filaments 46 when the filaments 46 are formed are made to be different by making the distances between the second semiconductor layers and the third semiconductor layers which configure the sources and the drains of the memory elements 20 different for each of the memory elements 20. Due to this, multiple value reading is possible.

It is obvious that both the difference of the on resistances and the difference of the filament resistances in each of the memory elements 20 may be obtained.

Here, the effects described in the present specification are only examples and the technology is not limited thereto and additionally, there may be other effects.

In addition, it is possible for the present technology to adopt the following configurations.

(1) A memory device including a memory cell which has one cell selection section and a storage section which is connected in series with respect to the cell selection section and which is selected as an access target for writing or reading by the cell selection section, in which the storage section is provided with a plurality of memory elements which are able to be written one time only and where information is held by changing resistance values in a non-written state and a written state.

(2) The memory device according to (1) described above, in which the memory elements have a first semiconductor layer formed of a first conductive type, in which a second semiconductor layer of a second conductive type and a third semiconductor layer of the second conductive type are separated, and writing is performed by applying a voltage, which is equal to or greater than a threshold voltage at which filaments which link between the second semiconductor layer and the third semiconductor layer are formed, between the second semiconductor layer and the third semiconductor layer.

(3) The memory device according to (2) described above, in which the memory elements have a dielectric body film, which is formed to continue from an upper surface of the first semiconductor layer which separates the second semiconductor layer and the third semiconductor layer, a portion of an upper surface of the second semiconductor layer, and a portion of an upper surface of the third semiconductor layer, and a conductive body film which is formed on the dielectric body film.

(4) The memory device according to (3) described above, in which the memory elements are MOS type elements where the first semiconductor layer is set as a well, one of the second semiconductor layer and the third semiconductor layer is set as a source or a drain, the dielectric body film is set as a gate oxide film, and the conductive film is set as a gate.

(5) The memory device according to any one of (2) to (4) described above, in which a silicide layer is formed on a portion of an upper section of the second semiconductor layer and a portion of an upper section of the third semiconductor layer.

(6) The memory device according to any one of (1) to (5) described above, in which the plurality of memory elements in the storage section are connected with each other in series, and all or some of the plurality of memory elements are configured such that it is possible to control conductivity or non-conductivity in a non-written state.

(7) The memory device according to (6) described above, in which, when one memory element out of the plurality of memory elements which are connected with each other in series in the storage section is set as a writing target and writing is performed, non-written memory elements other than the one memory element are controlled to be in a conductive state.

(8) The memory device according to (6) or (7) described above, in which the plurality of memory elements which are connected with each other in series in the storage section are each formed with a transistor structure, and each of the memory elements is controlled using a voltage which is applied to a gate of each of the memory elements such that on resistances in a non-written state are resistance values which are different from each other.

(9) The memory device according to (6) or (7) described above, in which the plurality of memory elements which are connected with each other in series in the storage section are each formed with a transistor structure, and each of the memory elements is formed such that on resistances in a non-written state are resistance values which are different from each other due to gate lengths, densities of each of the semiconductor layers, and gate oxide film thicknesses being different from each other.

(10) The memory device according to any one of (1) to (5) described above, in which the plurality of memory elements in the storage section are connected with each other in parallel and are each connected in series with the cell selection section.

(11) The memory device according to (10) described above, in which, when one memory element out of the plurality of memory elements which are connected with each other in parallel in the storage section is set as a writing target and writing is performed, for the memory elements other than the one memory element, a terminal on an opposite side to a series connection end with the cell selection section is controlled to be in an open state.

(12) The memory device according to (10) or (11) described above, in which, when one memory element out of the plurality of memory elements which are connected with each other in parallel in the storage section is set as a reading target and reading is performed, for the memory elements other than the one memory element, a terminal on an opposite side to a series connection end with the cell selection section is controlled to be in an open state.

(13) The memory device according to any one of (1) to (5) described above, in which a plurality of series element sections are provided in the storage section according to the plurality of memory elements which are connected with each other in series, each of the series element sections is connected with each other in parallel and each is connected with the cell selection section in series, and some or all of the plurality of memory elements in each of the series element sections are configured such that it is possible to control conductivity or non-conductivity in a non-written state.

(14) The memory device according to (13) described above, in which, when a memory element of one series element section out of the plurality of series element sections which are connected with each other in parallel in the storage section is set as a writing target and writing is performed, for the series element sections other than the one series element section, a terminal on an opposite side to a series connection end with the cell selection section is controlled to be in an open state and non-written memory elements in the one series element section other than the memory element which is the writing target are controlled to be a conductive state.

(15) The memory device according to (13) or (14) described above, in which, when one series element section out of the plurality of series element sections which are connected with each other in parallel in the storage section is set as a reading target and reading is performed, for the series element sections other than the one series element section, a terminal on an opposite side to a series connection end with the cell selection section is controlled to be in an open state.

(16) The memory device according to any one of (1) to (15) described above, in which the cell selection section is formed by a cell selection transistor, the plurality of memory elements in storage section are each formed with a transistor structure, and the cell selection transistor and each of the memory elements are formed on the same active region.

(17) The memory device according to any one of (1) to (16) described above, in which the cell selection section is formed by a cell selection transistor, the plurality of memory elements in storage section are each formed with a transistor structure, and the gate length of the cell selection transistor is larger than the gate lengths of each of the memory elements.

(18) A method for writing information with respect to a memory device which is provided with a memory cell which has one cell selection section and a storage section which is connected in series with respect to the cell selection section and which is selected as an access target for writing or reading by the cell selection section, in which the storage section is provided with a plurality of memory elements which are able to be written one time and where information is held by changing resistance values in a non-written state and a written state, the method including applying a predetermined potential difference or more to both ends of one memory element in the storage section of the memory cell which is the writing target by controlling the cell selection section of the memory cell which is a writing target to be in an on state using a word line which corresponds to the memory cell which is the writing target out of a plurality of word lines which are arranged with respect to a memory cell array where the memory cells are arranged in a shape of a matrix and applying a voltage using a bit line which corresponds to the memory cell which is the writing target out of a plurality of bit lines which are arranged with respect to the memory cell array, and writing to the one memory element.

(19) A method for reading information with respect to a memory device which is provided with a memory cell which has one cell selection section and a storage section which is connected in series with respect to the cell selection section and which is selected as an access target for writing or reading by the cell selection section, in which the storage section is provided with a plurality of memory elements which are able to be written one time and where information is held by changing resistance values in a non-written state and a written state, the method including reading information which is stored in the memory elements in the storage section by detecting a composite resistance value of the cell selection section and the storage section by controlling the cell selection section of the memory cell which is a reading target to be an on state using a word line which corresponds to the memory cell which is the reading target out of a plurality of word lines which are arranged with respect to a memory cell array where the memory cells are arranged in a shape of a matrix, and applying a voltage to the cell selection section of the memory cell which is the reading target and the storage section using a bit line which corresponds to the memory cell which is the reading target out of a plurality of bit lines which are arranged with respect to the memory cell array.

It should be understood by those skilled in the art that various modifications, combinations, sub-combinations and alterations may occur depending on design requirements and other factors insofar as they are within the scope of the appended claims or the equivalents thereof.

What is claimed is:

1. A memory device comprising:
a memory cell which has one cell selection section and a storage section which is connected in series with respect to the cell selection section and which is selected as an access target for writing or reading by the cell selection section,
wherein the storage section is provided with a plurality of memory elements which are able to be written one time only and where information is held by changing resistance values in a non-written state and a written state,
wherein the plurality of memory elements in the storage section are connected with each other in series, and
all or some of the plurality of memory elements are configured such that it is possible to control conductivity or non-conductivity in a non-written state,
wherein the plurality of memory elements which are connected with each other in series in the storage section are each formed with a transistor structure, and
each of the memory elements is formed such that on resistances in a non-written state are resistance values which are different from each other due to gate lengths, densities of each of the semiconductor layers, and gate oxide film thicknesses being different from each other.

2. A memory device comprising:
first regions of a first conductivity-type, the first conductivity-type is opposite to a second conductivity-type; and
second regions of the second conductivity-type, a first one of the second regions is between a first one of the first regions and a second one of the first regions,
wherein a second one of the second regions is between the second one of the first regions and a third one of the first regions, a third one of the second regions is between the third one of the first regions and a fourth one of the first regions, and
wherein the memory device is configurable to form an electrically conductive metallic filament in the second one of the second regions, the electrically conductive metallic filament in the second one of the second regions extends from within the second one of the first regions to within the third one of the first regions.

3. The memory device according to claim 2, wherein the first conductivity-type is N-type and the second conductivity-type is P-type.

4. The memory device according to claim 2, wherein the memory device is configurable to form an electrically conductive metallic filament in the third one of the second regions, the electrically conductive metallic filament in the third one of the second regions extends from within the third one of the first regions to within the fourth one of the first regions.

5. The memory device according to claim 4, wherein the memory device is configurable to form the electrically conductive metallic filament in the second one of the second regions before forming the electrically conductive metallic filament in the third one of the second regions.

6. The memory device according to claim 4, wherein the memory device is configurable to form the electrically conductive metallic filament in the second one of the second regions after forming the electrically conductive metallic filament in the third one of the second regions.

7. The memory device according to claim 2, wherein a distance between the first one of the first regions and the second one of the first regions is a first gate length, a distance between the second one of the first regions and the third one of the first regions is a second gate length.

8. The memory device according to claim 7, wherein the first gate length is greater than the second gate length.

9. The memory device according to claim 7, wherein a distance between the third one of the first regions and the fourth one of the first regions is a third gate length, the second gate length is greater than the third gate length.

10. The memory device according to claim 2, wherein a fourth one of the second regions is between the fourth one of the first regions and a fifth one of the first regions.

11. The memory device according to claim 10, wherein the memory device is configurable to form an electrically conductive metallic filament in the fourth one of the second regions, the electrically conductive metallic filament in the fourth one of the second regions extends from within the fourth one of the first regions to within the fifth one of the first regions.

12. A memory device comprising:
an active region that includes first regions of a first conductivity-type and second regions of a second conductivity-type, the second conductivity-type is opposite to the first conductivity-type;
fingers of the active region that extend from a body of the active region in a planar diagram of the memory device, a first one of the fingers is spaced apart from a second one of the fingers in the planar diagram;
a first one of the second regions that is between a first one of the first regions and a second one of the first regions, the first one of the second regions and the second one of the first regions are in the body;
a second one of the second regions that is between the second one of the first regions and a third one of the first regions, the second one of the second regions and the third one of the first regions are in the first one of the fingers; and
a third one of the second regions that is between the second one of the first regions and a fourth one of the first regions, the third one of the second regions and the fourth one of the first regions are in the second one of the fingers,
wherein the memory device is configurable to form an electrically conductive metallic filament in the second one of the second regions, the electrically conductive metallic filament in the second one of the second regions extends from within the second one of the first regions to within the third one of the first regions.

13. The memory device according to claim 12, wherein the first conductivity-type is N-type and the second conductivity-type is P-type.

14. The memory device according to claim 12, wherein the first one of the fingers and the second one of the fingers extend along a same direction.

15. The memory device according to claim 12, wherein the first one of the fingers and the second one of the fingers extend along different directions.

16. The memory device according to claim 12, wherein the memory device is configurable to form an electrically conductive metallic filament in the third one of the second regions, the electrically conductive metallic filament in the third one of the second regions extends from within the third one of the first regions to within the fourth one of the first regions.

17. The memory device according to claim 16, wherein the memory device is configurable to form the electrically conductive metallic filament in the second one of the second regions before forming the electrically conductive metallic filament in the third one of the second regions.

18. The memory device according to claim 16, wherein the memory device is configurable to form the electrically conductive metallic filament in the second one of the second regions after forming the electrically conductive metallic filament in the third one of the second regions.

19. The memory device according to claim 12, further comprising:
a fourth one of the second regions that is between the third one of the first regions and a fifth one of the first regions, the fourth one of the second regions and the fifth one of the first regions are in the first one of the fingers.

* * * * *